(12) United States Patent
Tois et al.

(10) Patent No.: US 11,170,993 B2
(45) Date of Patent: Nov. 9, 2021

(54) SELECTIVE PEALD OF OXIDE ON DIELECTRIC

(71) Applicant: ASM IP Holding B.V., Almere (NL)

(72) Inventors: Eva Tois, Helsinki (FI); Viljami Pore, Helsinki (FI); Suvi Haukka, Helsinki (FI); Toshiya Suzuki, Machida (JP); Lingyun Jia, Helsinki (FI); Sun Ja Kim, Helsinki (FI); Oreste Madia, Leuven (BE)

(73) Assignee: ASM IP HOLDING B.V., Almere (NL)

( * ) Notice: Subject to any disclaimer, the term of this patent is extended or adjusted under 35 U.S.C. 154(b) by 65 days.

(21) Appl. No.: 16/605,475

(22) PCT Filed: May 3, 2018

(86) PCT No.: PCT/US2018/030979
§ 371 (c)(1),
(2) Date: Oct. 15, 2019

(87) PCT Pub. No.: WO2018/213018
PCT Pub. Date: Nov. 22, 2018

(65) Prior Publication Data
US 2020/0066512 A1    Feb. 27, 2020

Related U.S. Application Data

(60) Provisional application No. 62/507,078, filed on May 16, 2017.

(51) Int. Cl.
*C23C 16/40* (2006.01)
*H01L 21/02* (2006.01)
*C23C 16/455* (2006.01)

(52) U.S. Cl.
CPC ...... *H01L 21/02274* (2013.01); *C23C 16/401* (2013.01); *C23C 16/45542* (2013.01);
(Continued)

(58) Field of Classification Search
CPC ..... C23C 16/40; C23C 16/401; C23C 16/402; C23C 16/45542; C23C 16/45553
See application file for complete search history.

(56) References Cited

U.S. PATENT DOCUMENTS

| 4,804,640 A | 2/1989 | Kaganowicz |
| 4,863,879 A | 9/1989 | Kwok |

(Continued)

FOREIGN PATENT DOCUMENTS

| EP | 0469456 A1 | 2/1992 |
| EP | 0880168 A2 | 11/1998 |

(Continued)

OTHER PUBLICATIONS

Wang, Changlei, et al., "Low-temperature plasma-enhanced atomic layer deposition of tin oxide electron selective layers for highly efficient planar perovskite solar cells". Journal of Materials Chemistry A, 2016,4, 12080-12087.*

(Continued)

*Primary Examiner* — Bret P Chen
(74) *Attorney, Agent, or Firm* — Knobbe, Martens, Olson & Bear LLP

(57) ABSTRACT

Methods for selectively depositing oxide thin films on a dielectric surface of a substrate relative to a metal surface are provided. The methods can include at least one plasma enhanced atomic layer deposition (PEALD) cycle including alternately and sequentially contacting the substrate with a first precursor comprising oxygen and a species to be included in the oxide, such as a metal or silicon, and a second plasma reactant. In some embodiments the second plasma reactant comprises a plasma formed in a reactant gas that does not comprise oxygen. In some embodiments the second plasma reactant comprises plasma generated in a gas comprising hydrogen.

23 Claims, 3 Drawing Sheets

(52) U.S. Cl.
CPC .... *C23C 16/45553* (2013.01); *H01L 21/0228* (2013.01); *H01L 21/02126* (2013.01); *H01L 21/02164* (2013.01); *H01L 21/02186* (2013.01); *H01L 21/02216* (2013.01)

(56) References Cited

U.S. PATENT DOCUMENTS

| | | | |
|---|---|---|---|
| 4,948,755 | A | 8/1990 | Mo |
| 5,288,697 | A | 2/1994 | Schrepp et al. |
| 5,447,887 | A | 9/1995 | Filipiak et al. |
| 5,604,153 | A | 2/1997 | Tsubouchi et al. |
| 5,633,036 | A | 5/1997 | Seebauer et al. |
| 5,869,135 | A | 2/1999 | Vaeth et al. |
| 5,925,494 | A | 7/1999 | Horn |
| 6,046,108 | A | 4/2000 | Liu et al. |
| 6,416,577 | B1 | 7/2002 | Suntoloa et al. |
| 6,426,015 | B1 | 7/2002 | Xia et al. |
| 6,455,414 | B1 | 9/2002 | Hillman et al. |
| 6,482,740 | B2 | 11/2002 | Soininen et al. |
| 6,586,330 | B1 | 7/2003 | Ludviksson et al. |
| 6,679,951 | B2 | 1/2004 | Soininen et al. |
| 6,759,325 | B2 | 7/2004 | Raaijmakers et al. |
| 6,811,448 | B1 | 11/2004 | Paton |
| 6,844,258 | B1 | 1/2005 | Fair et al. |
| 6,852,635 | B2 | 2/2005 | Satta et al. |
| 6,858,533 | B2 | 2/2005 | Chu et al. |
| 6,878,628 | B2 | 4/2005 | Sophie et al. |
| 6,887,795 | B2 | 5/2005 | Soininen et al. |
| 6,921,712 | B2 | 7/2005 | Soininen et al. |
| 6,958,174 | B1 | 10/2005 | Klaus et al. |
| 7,041,609 | B2 | 5/2006 | Vaartstra |
| 7,067,407 | B2 | 6/2006 | Kostamo et al. |
| 7,084,060 | B1 | 8/2006 | Furukawa et al. |
| 7,118,779 | B2 | 10/2006 | Verghese et al. |
| 7,220,669 | B2 | 5/2007 | Hujanen et al. |
| 7,241,677 | B2 | 7/2007 | Soininen et al. |
| 7,323,411 | B1 | 1/2008 | Blosse |
| 7,405,143 | B2 | 7/2008 | Leinikka et al. |
| 7,425,350 | B2 | 9/2008 | Todd |
| 7,476,618 | B2 | 1/2009 | Kilpela et al. |
| 7,494,927 | B2 | 2/2009 | Kostamo et al. |
| 7,595,271 | B2 | 9/2009 | White |
| 7,611,751 | B2 | 11/2009 | Elers |
| 7,695,567 | B2 | 4/2010 | Fu |
| 7,754,621 | B2 | 7/2010 | Putkonen |
| 7,790,631 | B2 | 9/2010 | Sharma et al. |
| 7,799,135 | B2 | 9/2010 | Verghese et al. |
| 7,910,177 | B2 | 3/2011 | Li |
| 7,914,847 | B2 | 3/2011 | Verghese et al. |
| 7,927,942 | B2 | 4/2011 | Raaijmakers |
| 7,951,637 | B2 | 5/2011 | Weidman et al. |
| 7,955,979 | B2 | 6/2011 | Kostamo et al. |
| 7,964,505 | B2 | 6/2011 | Khandelwal et al. |
| 8,173,554 | B2 * | 5/2012 | Lee .................... C23C 16/4554 438/792 |
| 8,293,597 | B2 | 10/2012 | Raaijmakers |
| 8,293,658 | B2 | 10/2012 | Shero et al. |
| 8,425,739 | B1 | 4/2013 | Wieting |
| 8,466,052 | B2 | 6/2013 | Baek et al. |
| 8,536,058 | B2 | 9/2013 | Kostamo et al. |
| 8,623,468 | B2 | 1/2014 | Lin et al. |
| 8,778,815 | B2 | 7/2014 | Yamaguchi et al. |
| 8,890,264 | B2 | 11/2014 | Dewey et al. |
| 8,921,228 | B2 * | 12/2014 | Swerts ................. C23C 16/18 438/680 |
| 8,956,971 | B2 | 2/2015 | Haukka et al. |
| 8,962,482 | B2 | 2/2015 | Albertson et al. |
| 8,980,418 | B2 | 3/2015 | Darling et al. |
| 8,993,404 | B2 | 3/2015 | Korbrinsky et al. |
| 9,067,958 | B2 | 6/2015 | Romero |
| 9,112,003 | B2 | 8/2015 | Haukka et al. |
| 9,129,897 | B2 | 9/2015 | Pore et al. |
| 9,136,110 | B2 | 9/2015 | Rathsack |
| 9,159,558 | B2 | 10/2015 | Cheng et al. |
| 9,236,292 | B2 | 1/2016 | Romero et al. |
| 9,257,303 | B2 | 2/2016 | Haukka et al. |
| 9,312,131 | B2 | 4/2016 | Bauer et al. |
| 9,349,687 | B1 | 5/2016 | Gates et al. |
| 9,353,139 | B2 | 5/2016 | Sundermeyer et al. |
| 9,455,138 | B1 | 9/2016 | Fukazawa et al. |
| 9,490,145 | B2 | 11/2016 | Niskanen et al. |
| 9,502,289 | B2 | 11/2016 | Haukka et al. |
| 9,552,979 | B2 | 1/2017 | Knaepen et al. |
| 9,679,808 | B2 | 6/2017 | Haukka et al. |
| 9,786,491 | B2 | 10/2017 | Suzuki et al. |
| 9,786,492 | B2 | 10/2017 | Suzuki et al. |
| 9,803,277 | B1 | 10/2017 | Longrie et al. |
| 9,805,974 | B1 | 10/2017 | Chen et al. |
| 9,816,180 | B2 | 11/2017 | Haukka et al. |
| 9,895,715 | B2 * | 2/2018 | Haukka .................. C23C 18/06 |
| 9,911,595 | B1 | 3/2018 | Smith et al. |
| 10,014,212 | B2 | 7/2018 | Chen et al. |
| 10,041,166 | B2 | 8/2018 | Longrie et al. |
| 10,047,435 | B2 * | 8/2018 | Haukka .................. C23C 16/30 |
| 10,049,924 | B2 | 8/2018 | Haukka et al. |
| 10,115,603 | B2 | 10/2018 | Niskanen et al. |
| 10,157,786 | B2 | 12/2018 | Haukka et al. |
| 10,186,420 | B2 | 1/2019 | Fukazawa |
| 10,204,782 | B2 | 2/2019 | Maes et al. |
| 10,343,186 | B2 | 7/2019 | Pore et al. |
| 10,373,820 | B2 | 8/2019 | Tois et al. |
| 10,428,421 | B2 * | 10/2019 | Haukka .................. C23C 16/405 |
| 10,443,123 | B2 | 10/2019 | Haukka et al. |
| 10,453,701 | B2 | 10/2019 | Tois et al. |
| 10,480,064 | B2 | 11/2019 | Longrie et al. |
| 10,546,741 | B2 | 1/2020 | Muramaki et al. |
| 10,553,482 | B2 * | 2/2020 | Wang .................... C23C 16/18 438/680 |
| 10,714,385 | B2 * | 2/2020 | Wang ................ H01L 21/76897 |
| 10,695,794 | B2 | 6/2020 | Pore et al. |
| 10,847,363 | B2 | 11/2020 | Tapily |
| 10,900,120 | B2 * | 1/2021 | Sharma .............. H01L 23/3171 |
| 2001/0019803 | A1 | 9/2001 | Mirkanimi |
| 2001/0021414 | A1 | 9/2001 | Morishima et al. |
| 2001/0025205 | A1 | 9/2001 | Chern et al. |
| 2002/0027261 | A1 | 3/2002 | Blesser et al. |
| 2002/0047144 | A1 | 4/2002 | Nguyen et al. |
| 2002/0068458 | A1 | 6/2002 | Chiang et al. |
| 2002/0090777 | A1 | 7/2002 | Forbes et al. |
| 2002/0107316 | A1 | 8/2002 | Bice et al. |
| 2003/0027431 | A1 | 2/2003 | Sneh et al. |
| 2003/0066487 | A1 | 4/2003 | Suzuki |
| 2003/0143839 | A1 | 7/2003 | Raaijmakers et al. |
| 2003/0176559 | A1 | 9/2003 | Bice et al. |
| 2003/0181035 | A1 | 9/2003 | Yoon et al. |
| 2003/0185997 | A1 | 10/2003 | Hsieh |
| 2003/0192090 | P1 | 10/2003 | Meilland |
| 2003/0193090 | A1 | 10/2003 | Otani et al. |
| 2004/0092073 | A1 | 5/2004 | Cabral |
| 2004/0129558 | A1 | 7/2004 | Liu et al. |
| 2004/0219746 | A1 | 11/2004 | Vaartstra et al. |
| 2005/0012975 | A1 | 1/2005 | George et al. |
| 2005/0136604 | A1 | 6/2005 | Al-Bayati et al. |
| 2005/0160575 | A1 | 7/2005 | Gambino et al. |
| 2005/0223989 | A1 | 10/2005 | Lee et al. |
| 2006/0019493 | A1 | 1/2006 | Li |
| 2006/0047132 | A1 | 3/2006 | Shenai-Khatkhate et al. |
| 2006/0121271 | A1 | 6/2006 | Frey et al. |
| 2006/0121677 | A1 | 6/2006 | Parekh et al. |
| 2006/0121733 | A1 | 6/2006 | Kilpela et al. |
| 2006/0128150 | A1 | 6/2006 | Gandikota et al. |
| 2006/0141155 | A1 | 6/2006 | Gordon et al. |
| 2006/0156979 | A1 | 7/2006 | Thakur et al. |
| 2006/0176559 | A1 | 8/2006 | Takatoshi et al. |
| 2006/0199399 | A1 | 9/2006 | Muscat |
| 2006/0226409 | A1 | 10/2006 | Burr et al. |
| 2006/0292845 | A1 | 12/2006 | Chiang et al. |
| 2007/0014919 | A1 | 1/2007 | Hamalainen et al. |
| 2007/0026654 | A1 | 2/2007 | Huotari et al. |
| 2007/0036892 | A1 | 2/2007 | Haukka et al. |
| 2007/0063317 | A1 | 3/2007 | Kim et al. |
| 2007/0098894 | A1 | 5/2007 | Verghese et al. |
| 2007/0099422 | A1 | 5/2007 | Wijekoon et al. |
| 2007/0232082 | A1 | 10/2007 | Balseanu et al. |

(56) References Cited

U.S. PATENT DOCUMENTS

| | | |
|---|---|---|
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1* | 9/2010 | Ishizaka ............ H01L 21/02063 438/659 |
| 2010/0270626 A1 | 10/2010 | Raisanen |
| 2010/0297474 A1 | 11/2010 | Dameron |
| 2010/0314765 A1 | 12/2010 | Liang et al. |
| 2011/0039420 A1 | 2/2011 | Nakao |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0198756 A1 | 8/2011 | Thenappan et al. |
| 2011/0221061 A1 | 9/2011 | Prakash |
| 2011/0244680 A1* | 10/2011 | Tohnoe ............ H01L 21/76849 438/677 |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0091541 A1 | 4/2012 | Suchomel et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0084700 A1* | 4/2013 | Swerts ................ C23C 16/18 438/680 |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1 | 6/2013 | Vaidya et al. |
| 2013/0189790 A1* | 7/2013 | Li ..................... B01L 3/5027 436/94 |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0319290 A1* | 12/2013 | Xiao ..................... C07F 7/025 106/287.11 |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0252487 A1 | 9/2014 | Stephens et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004317 A1 | 1/2015 | Dussarrat et al. |
| 2015/0004319 A1 | 1/2015 | Mizue |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1* | 6/2015 | Thompson ........ H01L 21/32051 438/669 |
| 2015/0170961 A1 | 6/2015 | Romero et al. |
| 2015/0179798 A1 | 6/2015 | Clendenning et al. |
| 2015/0217330 A1* | 8/2015 | Haukka ............... C23C 18/1216 427/343 |
| 2015/0240121 A1 | 8/2015 | Sugita et al. |
| 2015/0275355 A1 | 10/2015 | Mallikarjunan et al. |
| 2015/0299848 A1* | 10/2015 | Haukka .................. C23C 16/18 427/123 |
| 2015/0371866 A1 | 12/2015 | Chen et al. |
| 2015/0372205 A1 | 12/2015 | Kimura et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0152640 A1 | 6/2016 | Kuchenbeiser et al. |
| 2016/0172189 A1 | 6/2016 | Tapily |
| 2016/0186004 A1 | 6/2016 | Hustad et al. |
| 2016/0190060 A1 | 6/2016 | Bristol et al. |
| 2016/0222504 A1* | 8/2016 | Haukka ............... C23C 16/0272 |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293384 A1 | 10/2016 | Yan et al. |
| 2016/0293398 A1 | 10/2016 | Danek et al. |
| 2016/0315191 A1 | 10/2016 | Tsai et al. |
| 2016/0346838 A1 | 12/2016 | Fujita et al. |
| 2016/0365280 A1 | 12/2016 | Brink et al. |
| 2017/0037513 A1* | 2/2017 | Haukka .................. C23C 16/04 |
| 2017/0040164 A1* | 2/2017 | Wang .................. H01L 21/02178 |
| 2017/0051405 A1* | 2/2017 | Fukazawa ............. C23C 16/345 |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0332179 A1 | 11/2017 | Bright et al. |
| 2017/0352533 A1 | 12/2017 | Tois et al. |
| 2017/0352550 A1 | 12/2017 | Tois et al. |
| 2017/0358482 A1* | 12/2017 | Chen .................... H01L 21/3105 |
| 2018/0010247 A1 | 1/2018 | Niskanen et al. |
| 2018/0040708 A1 | 2/2018 | Narayanan et al. |
| 2018/0073136 A1 | 3/2018 | Haukka et al. |
| 2018/0080121 A1 | 3/2018 | Longrie et al. |
| 2018/0096888 A1* | 4/2018 | Naik .................. H01L 21/76849 |
| 2018/0142348 A1* | 5/2018 | Yu ........................ C23C 16/403 |
| 2018/0151345 A1 | 5/2018 | Haukka et al. |
| 2018/0151355 A1 | 5/2018 | Fukazawa |

(56) References Cited

U.S. PATENT DOCUMENTS

| | | |
|---|---|---|
| 2018/0182618 A1 | 6/2018 | Blanquart et al. |
| 2018/0222933 A1 | 8/2018 | Romero |
| 2018/0233350 A1 | 8/2018 | Tois et al. |
| 2018/0243787 A1 | 8/2018 | Haukka et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0100837 A1 | 4/2019 | Haukka et al. |
| 2019/0155159 A1 | 5/2019 | Knaepen et al. |
| 2019/0283077 A1 | 9/2019 | Pore et al. |
| 2019/0333761 A1 | 10/2019 | Tois et al. |
| 2019/0341245 A1 | 11/2019 | Tois et al. |
| 2020/0051829 A1 | 2/2020 | Tois et al. |
| 2020/0105515 A1 | 4/2020 | Maes et al. |

FOREIGN PATENT DOCUMENTS

| | | | |
|---|---|---|---|
| EP | 1340269 | 2/2009 | |
| EP | 3026055 | 6/2016 | |
| JP | 2001127068 | 5/2001 | |
| JP | 2008311603 | 12/2008 | |
| JP | 2011018742 | 1/2011 | |
| JP | 2011-187583 | 9/2011 | |
| JP | 2014-93331 | 5/2014 | |
| KR | 102001001072 | 2/2001 | |
| KR | 1020020010821 | 2/2002 | |
| KR | 20030027392 | 4/2003 | |
| KR | 1020040056026 | 6/2004 | |
| KR | 1020050103811 | 11/2005 | |
| KR | 10-0920033 | 10/2009 | |
| TW | 2005-39321 | 12/2005 | |
| TW | 2010-05827 | 2/2010 | |
| TW | 2014-39365 | 10/2014 | |
| WO | WO 2002/045167 | 6/2002 | |
| WO | WO 2011/156705 | 12/2011 | |
| WO | WO 2013/161772 | 10/2013 | |
| WO | WO 2014/156782 | 10/2014 | |
| WO | WO 2014209390 A1 | 12/2014 | |
| WO | WO 2015/047345 | 4/2015 | |
| WO | WO 2015094305 A1 | 6/2015 | |
| WO | WO 2015147843 A1 | 10/2015 | |
| WO | WO 2015147858 A1 | 10/2015 | |
| WO | WO 2016/178978 A1 * | 11/2016 | ........... C23C 16/455 |
| WO | WO 2017/184357 | 10/2017 | |
| WO | WO 2017/184358 | 10/2017 | |
| WO | WO 2018/204709 | 11/2018 | |
| WO | WO 2018/213018 | 11/2018 | |

OTHER PUBLICATIONS

Vallat, Remi, et al., "Selective deposition of Ta2O5 by adding plasma etching super-cycles in plasma enhanced atomic layer deposition steps". J. Vac. Sci. Technol. A 35(1), Jan.-Feb. 2017, 01B104 (2017), pp. 1-7. https://doi.org/10.1116/1.4965966.*
Lin, Ru-Zheng, et al., "Selective Deposition of Multiple Sensing Materials on Si Nanobelt Devices through Plasma-Enhanced Chemical Vapor Deposition and Device-Localized Joule Heating". ACS Appl. Mater. Interfaces 2017, 9, 39935-39939. DOI: 10.1021/acsami.7b13896.*
Hashemi, Fatemeh Sadat Minaye, et al., "Selective Deposition of Dielectrics: Limits and Advantages of Alkanethiol Blocking Agents on Metal-Dielectric Patterns". ACS Appl. Mater. Interfaces 2016, 8, 33264-33272. DOI: 10.1021/acsami.6b09960.*
Hu, Liang, et al., "Coating strategies for atomic layer deposition". Nanotechnol Rev 2017; 6(6): 527-547.*
Vallat, Remi, et al., "Selective deposition of Ta2O5 by adding plasma etching super-cycles in plasma enhanced atomic layer deposition steps". J. Vac. Sci. Technol. A 35(1), Jan./Feb. 2017, 01B104, pp. 1-7.*
Wang, Changlei, et al., "Low-temperature plasma-enhanced atomic layer deposition of tin oxide electron selective layers for highly efficient planar perovskite solar cells". J. Mater. Chem. A, 2016, 4, 12080-12087.*

Vallat, Remi, et al., "Area selective deposition of TiO2 by intercalation of plasma etching cycles in PEALD process: A bottom up approach for the simplification of 3D integration scheme". J. Vac. Sci. Technol. A 37(2), Mar./Apr. 2019, Feb. 9 2018, pp. 1-12.*
File History of U.S. Appl. No. 16/033,952, filed Jul. 12, 2018.
File History of U.S. Appl. No. 16/399,328, filed Apr. 30, 2019.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.
Aaltonen et al., "Atomic Layer Deposition of Iridium Thin Films", Journal of The Electrochemical Society, 151 (8) G489-G492 (2004).
Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.
Benzotriazole, Wikipedia via https://en.wikipedia.org/wiki/Benzotriazole; pp. 1-5, no date available.
Bernal-Ramos, et al., "Atomic Layer Deposition of Cobalt Silicide Thin Films Studied by in Situ Infrared Spectroscopy", Chem. Mater. 2015, 27, pp. 4943-4949.
Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.
Burton, B.B. et al., "Atomic Layer Deposition of MgO Using Bis(ethylcyclopentadienyl)magnesium and H20". J. Phys. Chem. C, 2009, 113, 1939-1946.
Burton, B.B., et al., "Si02 Atomic Layer Deposition Using Tris(dimethylamino)silane and Hydrogen Peroxide Studied by in Situ Transmission FTIR Spectroscopy". J. Phys. Chem. C, 2009, 113, 8249-8257.
Carlsson, J., "Precursor Design for Chemical Vapour Deposition", Acta Chemica Scandinavica, vol. 45, 1991, pp. 864-869.
Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.
Chen et al., Highly Stable Monolayer Resists for Atomic Layer Deposition on Germanium and Silicon, Chem. Matter, vol. 18, No. 16, pp. 3733-3741, 2006.
Coclite, et al.; 25th Anniversary Article: CVD Polymers: A New Paradigm for Surface Modification and Device Fabrication; Advanced Materials; Oct. 2013; 25; pp. 5392-5423.
Elam et al., "Kinetics of the WF6 and Si2H6 surface reactions during tungsten atomic layer deposition", Surface Science, vol. 479, 2001, pp. 121-135.
Elam et al., "Nucleation and growth during tungsten atomic layer deposition on SiO2 surfaces", Thin Solid Films, vol. 386, 2001 pp. 41-52.
Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.
Fabreguette et al., Quartz crystal microbalance study of tungsten atomic layer deposition using WF6 and Si2H6, Thin Solid Films, vol. 488, 2005, pp. 103-110.
Farm et al. Selective-Area Atomic Layer Deposition Using Poly( methyl methacrylate) Films as Mask Layers, J. Phys. Chem. C, 2008, 112, pp. 15791-15795. (Year: 2008).
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999, no page numbers.
File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687,833, filed Apr. 15, 2015.
File History of U.S. Appl. No. 16/100,855, filed Aug. 10, 2018.
File History of U.S. Appl. No. 16/594,365, filed Oct. 7, 2019.
File History of U.S. Appl. No. 14/628,799, filed Feb. 23, 2015.

(56) References Cited

OTHER PUBLICATIONS

File History of U.S. Appl. No. 15/331,366, filed Oct. 21, 2016.
File History of U.S. Appl. No. 16/143,888, filed Sep. 27, 2018.
File History of U.S. Appl. No. 14/817,161, filed Aug. 3, 2015.
File History of U.S. Appl. No. 14/819,274, filed Aug. 5, 2015.
File History of U.S. Appl. No. 16/787,672, filed Feb. 11, 2020.
File History of U.S. Appl. No. 15/432,263, filed Feb. 14, 2017.
File History of U.S. Appl. No. 16/158,780, filed Oct. 12, 2018.
File History of U.S. Appl. No. 16/773,064, filed Jan. 27, 2020.
File History of U.S. Appl. No. 15/221,453, filed Jul. 27, 2016.
File History of U.S. Appl. No. 16/575,112, filed Sep. 18, 2019.
File History of U.S. Appl. No. 15/177,195, filed Jun. 8, 2016.
File History of U.S. Appl. No. 15/795,768, filed Oct. 27, 2017.
File History of U.S. Appl. No. 16/040,844, filed Jul. 20, 2018.
File History of U.S. Appl. No. 16/676,017, filed Nov. 6, 2019.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 15/971,601, filed May 4, 2018.
File History of U.S. Appl. No. 13/708,863, filed Dec. 7, 2012.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
File History of U.S. Appl. No. 13/702,992, filed Mar. 26, 2013.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
Formic Acid, Wikipedia via https://en.wikipedia.org/wiki/Formic_acid; pp. 1-5, no date available.
George, Steven M., "Atomic Layer Deposition: An Overview", Chem. Rev. 2010, 110, pp. 111-113.
Ghosal et al., Controlling Atomic Layer Deposition of TiO2 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, p. 33264-33272.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
International Search Report and Written Opinion dated Feb. 17, 2012 in Application No. PCT/US2011/039970, filed Jun. 10, 2011.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, p. 031605-1-031605-8.
Lee et al., Area-Selective Atomic Layer Deposition Using Self-Assembled Monolayer and Scanning Probe Lithography, Journal of The Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films 488,2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, p. 116102-1-116102-3, 2010.
Mackus et al., "The use of atomic layer deposition in advanced nanopatterning", Nanoscale, 2014, 6, p. 10941-10960.
Maluf et al., "Selective tungsten filling of sub-0.25μm trenches for the fabrication of scaled contacts and x-ray masks", J. Vac. Sci. Technol. B, vol. 8, No. 3, May/Jun. 1990, pp. 568-569.
Norrman, et al.; 6 Studies Of Spin-Coated Polymer Films; Annu. Rep. Prag. Chem.; Sect. C; 2005; 101; pp. 174-201.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, Mar. 29, 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, p. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition Of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN #etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.

(56) References Cited

OTHER PUBLICATIONS

Senesky et al., "Aluminum nitride as a masking material for the plasma etching of silicon carbide structures," 2010, IEEE, pp. 352-355.

Schuiskly et al., "Atomic Layer Deposition of Thin Films Using O2 as Oxygen Source", Langmuir, vol. 17, No. 18, 2001, pp. 5508-5512.

Sundberg, et al.; Organic and Inorganic-Organic Thin Film Structures By Molecular Layer Deposition: A Review; Beilstein J. Nanotechnol; 2014, 5, pp. 1104-1136.

Suntola, Tuomo, "Thin Films and Epitaxy Part B: Grown mechanism and Dynamics", Handbook of Crystal Growth vol. 3, Elsevier, 1994, 33 pages.

Ting, et al., "Selective Electroless Metal Deposition for Integrated Circuit Fabrication", J. Electrochem. Soc., vol. 136, No. 2, Feb. 1989, pp. 456-462.

Toirov, et al.; Thermal Cyclodehydration of Polyamic Acid Initiated by UV-Irradiation; Iranian Polymer Journal; vol. 5, No. 1; p. 1A323:C3286-22; 1996; Iran.

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Vallat et al., Selective deposition of Ta2O5 by adding plasma etching super-cycles in plasma enhanced atomic layer deposition steps, Journal of Vacuum Science & Technology A, vol. 35, No. 1, p. 01B104-1-01B104-7, Jan. 2017.

Vervuurt et al., "Area-selective atomic layer deposition of platinum using photosensitive polyimide", Nanotechnology 27, 2016, in 6 pages.

Zhou, et al.; Fabrication of Organic Interfacial Layers By Molecular Layer Deposition: Present Status and Future Opportunities; Journal of Vacuum Science & Technology; A 31 (4), 040801-1 to 040801-18; 2013.

Cho et al., "Atomic layer deposition of $Al_2O_3$ thin films using dimethylaluminum isopropoxide and water", Journal of Vacuum Science & Technology A 21, (2003), doi: 10.1116/1.1562184, pp. 1366-1370.

File History of U.S. Appl. No. 16/588,600, filed Sep. 30, 2019.
File History of U.S. Appl. No. 16/836,151, filed Mar. 31, 2020.
File History of U.S. Appl. No. 16/987,990, filed Aug. 7, 2020.
File History of U.S. Appl. No. 17/135,001, filed Dec. 28, 2020.
File History of U.S. Appl. No. 17/113,383, filed Dec. 7, 2020.
File History of U.S. Appl. No. 17/064,865, filed Oct. 7, 2020.

* cited by examiner

67W

300W the invention

SELECTIVE PEALD OF OXIDE ON DIELECTRIC

BACKGROUND

Field of the Invention

The present disclosure relates generally to the field of semiconductor device manufacturing and, more particularly, to selective plasma enhanced atomic layer deposition (PEALD) of oxide films.

Description of the Related Art

In the semiconductor industry, there is an increasing need for selective processes. For example, film growth may be desired on one surface but not on a second, different surface. These two different surfaces can comprise different materials, for example a metal and a dielectric. Good selective processes could reduce the number of process steps thus saving time and money.

SUMMARY OF THE INVENTION

The present application relates to the selective deposition of an oxide on a substrate by plasma enhanced atomic layer deposition (PEALD). The oxide may comprise, for example, $SiO_2$, SiOC, SiOCN or a metal oxide. In some embodiments the oxide comprises both metal and silicon. In some embodiments the oxide is selectively deposited on a dielectric surface of a substrate. In some embodiments the PEALD process does not utilize oxygen plasma or other reactive oxygen species. Thus, in some embodiments one of the reactants comprises reactive species from a plasma generated in a gas that does not comprise oxygen.

In some embodiments, a PEALD process for selectively depositing an oxide on a dielectric surface of a substrate comprises providing a substrate comprising a first dielectric surface and a second, different surface, such as a metal surface. At least one deposition cycle is carried out comprising alternately and sequentially contacting the substrate with a first precursor comprising oxygen and a component of the oxide, such as silicon or metal, and a second reactant. In some embodiments the second reactant comprises reactive species from a plasma generated in a gas that does not comprise oxygen. For example, the second reactant may comprise hydrogen plasma. The hydrogen plasma may be generated in a gas comprising $H_2$. The second reactant reacts with the first precursor adsorbed on the substrate surface to selectively form an oxide on the first dielectric surface relative to the second metal surface. In some embodiments the second reactant also reacts with the metal surface to reduce metal oxide that may be present on the metal surface. The second reactant may also remove OH groups that may be present on the metal surface. The deposition cycle may be repeated two or more times to form an oxide of the desired thickness on the dielectric surface. In some embodiments the second reactant is provided first, such that it reacts with the surface of the substrate, either with the dielectric surface where it can act to condition the surface for subsequent deposition, or with adsorbed first reactant from a prior deposition cycle.

In some embodiments the dielectric surface comprises $SiO_2$. In some embodiments the dielectric surface comprises a low-k material. The metal surface may comprise, for example, Co, W, TiN, Cu or Ta.

In some embodiments the oxide that is selectively deposited comprises $SiO_2$, SiOC or SiOCN. In some embodiments the oxide is a metal oxide, such as titanium oxide. In some embodiments the oxide is any metal oxide that can be deposited from an oxygen containing precursor. In some embodiments the oxide that is selectively deposited comprises a mixture of two or more oxides. In some embodiments the oxide that is deposited comprises a mixture of two or more metal oxides. In some embodiments the oxide that is deposited comprises a mixture of silicon oxide and one or more metal oxides. In some embodiments an oxide is deposited that comprises metal and silicon, such as SiTiOx. In some embodiments a silicate is deposited.

In some embodiments the first precursor is a silicon precursor, such as 3-methoxypropyltrimethoxysilane (MPTMS). In some embodiments the first precursor is MPTMS and the second reactant comprises hydrogen plasma. In some embodiments the first precursor is a metal precursor.

In some embodiments the metal surface comprises a passivation layer, such as an organic material. An organic passivation layer may be selectively deposited on the metal surface relative to the dielectric surface prior to beginning the selective oxide deposition. In some embodiments a passivation layer on the metal surface is etched by the second reactant in the oxide deposition cycle.

In some embodiments, methods of selectively depositing a silicon oxide film on a dielectric surface of a substrate relative to a metal surface are provided. The methods may be PEALD methods, comprising a deposition cycle in which the substrate is alternately and sequentially contacted with a first reactant comprising silicon and oxygen and a second plasma reactant that does not comprise oxygen species. In some embodiments the second plasma reactant comprises plasma generated in a gas that does not comprise oxygen. In some embodiments the second plasma reactant comprises plasma generated in a gas comprising hydrogen and not oxygen. Species of the first reactant comprising silicon and oxygen adsorb on the dielectric surface and react with the second plasma reactant to form silicon oxide. In some embodiments the second plasma reactant comprises hydrogen plasma.

DETAILED DESCRIPTION

Oxide films, such as silicon oxycarbide (SiOC) films, have a wide variety of applications, as will be apparent to the skilled artisan, for example in integrated circuit fabrication.

According to some embodiments of the present disclosure, various dielectric films, particularly oxide films, precursors, and methods for depositing such films are provided.

Figure 1:
FIG. 1 is a schematic of some embodiments, in which an oxide film is selectively deposited on $SiO_2$ relative to a metal surface. The metal surface may be simultaneously reduced during deposition of SiOC on $SiO_2$. SiOC may deposited by MPTMS and hydrogen plasma.

In some embodiments oxide thin films, for example dielectric films such as $SiO_2$, SiOC or other SiO-based dielectric films, or metal oxide films, are selectively deposited on a substrate by plasma-enhanced atomic layer deposition (PEALD) processes. In some embodiments an oxide film is selectively deposited on a first dielectric surface of a substrate relative to a second, different metal or metallic surface of the substrate by a PEALD process. For example, $SiO_2$ may be selectively deposited by PEALD on a $SiO_2$ surface relative to a metal surface. FIG. 1 shows a schematic of some embodiments, in which an oxide film is selectively deposited on $SiO_2$ relative to a metal surface.

According to some embodiments the oxide film is selectively deposited using a PEALD process comprising contacting the substrate with a first precursor and a plasma reactant, such as a plasma generated in a gas comprising hydrogen. For example, the PEALD process may comprise contacting the substrate with a first precursor comprising silicon and oxygen and a second precursor comprising plasma generated in a gas comprising Ar and $H_2$ (referred to herein as Ar/$H_2$ plasma) but not oxygen. The first precursor may contain both oxygen and one or more elements to be included in the oxide, such as a metal or silicon. The oxide film grows on a first surface, such as a dielectric surface. The growth is less or does not occur on a second surface, such as a metal or metallic surface. The plasma reactant in the PEALD process may serve two functions. First, it may serve as a reactant in the deposition process where it reacts with a previously adsorbed precursor on the dielectric surface to form the desired oxide on that surface. Second, the plasma acts on the metal surface to reduce or inhibit formation of oxide on that surface. Growth on the second metal surface may be inhibited, for example by reducing metal oxide on the metal surface, if any, and/or by removing oxygen from the metal surface, such as by removing OH groups and/or metal-oxygen bridges from the metal surface. The plasma does not remove oxygen (such as OH groups and/or metal-oxygen bridges) as easily from the first dielectric surface, such as a silicon oxide dielectric surface. The first precursor thus reacts and chemisorbs to the dielectric surface containing a greater concentration of OH-groups preferentially, relative to the reduced metal surface, having fewer OH-groups. As a result, the oxide is selectively deposited on the first dielectric surface relative to the second metal or metallic surface.

In some embodiments a substrate comprising a first surface on which deposition of a dielectric material is desired, such as a dielectric surface, and second surface on which deposition is not desired, such as a metal surface, is alternately and sequentially contacted with a precursor comprising oxygen and one or more elements to be included in the deposited material and a plasma reactant. In some embodiments the plasma reactant comprises plasma generated in a gas that does not comprise oxygen. In some embodiments the plasma reactant does not comprise oxygen species. In some embodiments no reactants comprising oxygen species are used other than the first reactant. In some embodiments the plasma reactant comprises plasma generated in a gas comprising hydrogen. The precursor comprising oxygen and the plasma may be provided in pulses separated by a purge in which excess reactant and reaction byproducts, if any, are removed from the reaction space.

In some embodiments the deposition process begins with a plasma pulse, and the reaction sequence, or deposition cycle, may be repeated a desired number of times (A):

$$A\times(RF/purge/precursor/purge)$$

In some embodiments the deposition cycle begins with a precursor pulse, which is followed by a plasma pulse.

In some embodiments a reducing plasma step may be provided before starting the deposition cycle. The reducing plasma step may be longer than the exposure to the plasma reactant in the deposition cycle. In some embodiments the reducing plasma a step is included in the deposition process at one or more intervals. In some embodiments the reducing plasma step is included before two or more deposition cycles. In some embodiments the reducing plasma step is included before each deposition cycle.

The plasma in the longer reducing step may be the same as the plasma used in the deposition cycle, or may differ. This reducing plasma step may reduce substantially all metal oxide from the metal surface and ensure that substantially all OH groups or metal oxide bridges are removed from the metal surface:

$$(long\ pulse/high\ power\ RF)+A\times(RF/purge/precursor/purge)$$

By optimizing the plasma and other process conditions, the reducing power can be tuned to such that the desired level of selectivity is obtained. In some embodiments, the process conditions, such as plasma power, can be tuned such that growth does not proceed appreciably on the metal surface, or even at all. In some embodiments plasma power can also be used to tune the k value and wet etch resistance of the oxide film that is deposited.

In some embodiments the plasma that is used in the deposition cycle and/or for the reducing plasma step is hydrogen based. For example, the plasma may be generated in a gas comprising hydrogen, such as in $H_2$ gas, a mixture of $H_2$ and a noble gas, such as Ar, or in another gas comprising $H_2$. In some embodiments the plasma is nitrogen based, or comprises nitrogen species. For example, the plasma may be generated in a gas comprising nitrogen, such as a gas comprising $N_2$, or a mixture of $N_2$ and a noble gas, such as Ar. In some embodiments the plasma does not comprise oxygen species. In some embodiments the plasma is generated in a gas or gas mixture that does not comprise oxygen. However, in some embodiments the plasma may be generated in a gas comprising oxygen, or may otherwise comprise excited oxygen species. In some embodiments the plasma does not comprise nitrogen species. Plasma gases with more reducing power are preferable in some embodiments. In some embodiments noble gas alone can be used for generating the plasma. Thus, in some embodiments the plasma is generated in a noble gas, such as Ar gas without any other components.

In some embodiments plasma, for example hydrogen containing plasma may be generated by applying RF power of from about 5 W to about 5000 W, 10 W to about 2000 W, from about 20 W to about 1000 W, from about 30 W to 500 W or from about 50 W to about 200 W. In some embodiments the RF power density may be from about 0.02 W/cm$^2$ to about 2.0 W/cm$^2$, or from about 0.05 W/cm$^2$ to about 1.5 W/cm$^2$. The RF power may be applied to second reactant that flows during the plasma contacting time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate.

In some embodiments SiOC films are deposited. In some embodiments oxides other than SiOC are deposited. In some embodiments the oxides include oxophilic elements. For example, oxides that can be deposited by the methods disclosed herein include SiOCN, SiOSC, $TiO_2$, $Al_2O_3$, $Nb_2O_5$, $Ta_2O_5$ and $SiO_2$. Again, in some embodiments the precursor utilized contains both oxygen and a second element desired in the oxides, such as metal or silicon.

Unless otherwise indicated, if a surface is referred to as a metal surface herein, it may be a metal surface or a metallic surface. In some embodiments the metal or metallic surface may comprise metal, metal oxides, and/or mixtures thereof. In some embodiments the metal or metallic surface may comprise surface oxidation. In some embodiments the metal or metallic material of the metal or metallic surface is electrically conductive with or without surface oxidation. In some embodiments metal or a metallic surface comprises one or more transition metals. In some embodiments the metal or metallic surface comprises one or more of Al, Cu, Co, Ni, W, Nb, Fe. In some embodiments the metal or metallic surface comprises Cu. In some embodiments the metal or metallic surface comprises one or more noble metals, such as Ru. In some embodiments the metal or metallic surface comprises a conductive metal oxide, nitride, carbide, boride, or combination thereof. For example, the metal or metallic surface may comprise one or more of $RuO_x$, $NbC_x$, $NbB_x$, $NiO_x$, $CoO_x$, $NbO_x$, $WNC_x$. In some embodiments the substrate may comprise a metal nitride, including, but not limited to TiN and/or TaN. In some embodiments the metal surface may comprise a metal carbide, including, but not limited to TiC and/or TaC. In some embodiments the metal surface may comprise a metal chalcogenide, including, but not limited to $MoS_2$, $Sb_2Te_3$, and/or GeTe. In some embodiments the metal surface is a TiN surface. In some embodiments the metal surface is a W surface.

In some embodiments the metal surface may comprise Zn, Fe, Mn, or Mo.

In some embodiments the metal surface comprises Co, W, TiN, Ta or Cu.

In some embodiments the dielectric surface may be, for example, a silicon oxide surface, such as a $SiO_2$ surface. In some embodiments the dielectric surface may be a low-k surface.

In some embodiments a passivation layer, such as an organic layer, may be present on the substrate prior to deposition, such as on the metal surface. In some embodiments a passivation layer is present on the metal surface but not on the dielectric surface.

In some embodiments a passivation layer may be deposited on the metal surface prior to selective deposition of the oxide on the dielectric surface. For example, in some embodiments, a passivation layer may be selectively deposited on a metal layer. Selective deposition of a passivation layer may be carried out, for example, as described below, and as described in U.S. patent application Ser. No. 15/170, 769 or U.S. patent application Ser. No. 15/486,124, each of which is incorporated by reference herein.

In some embodiments a passivation layer may be present on both the metal surface and the dielectric surface prior to deposition. In some embodiments the passivation layer is thicker over the metal surface than over the dielectric surface.

The plasma reactant used in the deposition process, or in the plasma treatment prior to the deposition process, may etch the passivation layer, such that the passivation layer is etched fully away from the dielectric surface on which deposition is desired, while some passivation layer remains on the metal surface. The selectivity of the deposition process on the dielectric surface relative to the metal surface (comprising the passivation layer) can thus be achieved or enhanced. In some embodiments etching of the passivation layer occurs during the selective deposition of the oxide, such as through the activity of the plasma reactant.

In some embodiments the passivation layer over the metal surface may be replenished during the deposition process in order to achieve better selectivity when thicker films are deposited.

If no passivation layer is present, or a passivation layer is completely removed, the plasma may serve as described above to keep the metal as metallic, and remove OH-groups and/or metal oxide, such that the oxide is selectively deposited on the dielectric surface, such as an $SiO_2$ or low-k surface, relative to the metal or metallic surface.

As mentioned above, in some embodiments the substrate may comprise an organic passivation layer. In some embodiments where the substrate comprises an organic material the reaction temperature of a PEALD process may be less than about 200° C. In some such embodiments the reaction temperature may be less than about 150° C., less than about 100° C., less than about 75° C., or less than about 50° C. Deposition temperatures in the absence of a passivation layer are described below.

In some embodiments the substrate on which deposition is desired, such as a semiconductor workpiece, is loaded into a reaction space or reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch AU) reactors are used, the number of substrates is in the range of 10 to 200, in the range of 50 to 150, or in the range of 100 to 130.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc of Phoenix, Ariz. and ASM Europe B.V., Almere, Netherlands. Other commercially available reactors include those from ASM Japan K.K (Tokyo, Japan) under the tradename Eagle® XP and XP8.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

Selectivity

Selectivity can be given as a percentage calculated by [(deposition on first surface)−(deposition on second surface)]/(deposition on the first surface). Deposition can be measured in any of a variety of ways. In some embodiments deposition may be given as the measured thickness of the deposited material. In some embodiments deposition may be given as the measured amount of material deposited.

In some embodiments selectivity is greater than about 10%, greater than about 50%, greater than about 75%, greater than about 85%, greater than about 90%, greater than about 93%, greater than about 95%, greater than about 98%, greater than about 99% or even greater than about 99.5%. In embodiments described herein, the selectivity can change over the duration or thickness of a deposition.

In some embodiments deposition of the oxide only occurs on the first dielectric surface and does not occur on the second metal surface. In some embodiments deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular applications. In some embodiments the deposition on the first surface of the substrate relative to the second surface of the substrate is at least about 10% selective, which may be selective enough for some particular applications.

Selective Deposition of a Passivation Layer

In some embodiments, a passivation layer is selectively deposited on a first metal or metallic surface of a substrate relative to a second dielectric surface in order to facilitate or enhance subsequent selective deposition of an oxide on the dielectric surface relative to the metal surface, as described herein. In the selective deposition of the passivation layer, in some embodiments a first organic reactant is vaporized to form a first reactant vapor. The reactant being vaporized may be liquid or solid under standard temperature and pressure conditions (room temperature and atmospheric pressure). In some embodiments, the reactant being vaporized comprises an organic precursor, such as an amine, for example a diamine, such as 1,6-diamnohexane (DAH), or another organic precursor, such as a dianhydride, for example pyromellitic dianhydride (PMDA). The substrate is then exposed to the first reactant vapor and an organic film is selectively deposited. The method can include additional steps, and may be repeated. For example, as described below in some embodiments two reactants are utilized to selectively deposit a passivation layer on a metal surface relative to a dielectric surface.

In some embodiments, the organic film comprises a polymer. In some embodiments, the polymer deposited is a polyimide. In some embodiments, the polymer deposited is a polyamide. Other examples of deposited polymers include dimers, trimers, polyurethanes, polythioureas, polyesters, polyimines, other polymeric forms or mixtures of the above materials.

In some embodiments, a substrate comprising a first conductive surface, for example a metal or metallic surface, and a second dielectric surface is provided and alternately and sequentially exposed to a first vapor phase reactant and a second vapor phase reactant in a deposition cycle.

In some embodiments the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In some embodiments the second precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In some embodiments a deposition cycle may repeated until an organic film of a desired thickness is selectively deposited on the metal surface.

Various reactants can be used for the above described processes. For example, in some embodiments, the first precursor or reactant is an organic reactant such as a diamine, e.g., 1,6-diamnohexane (DAH), or any other monomer with two reactive groups.

In some embodiments, the second reactant or precursor is also an organic reactant capable of reacting with adsorbed species of the first reactant under the deposition conditions. For example, the second reactant can be an anhydride, such as furan-2,5-dione (maleic acid anhydride), or more particularly a dianhydride, e.g., pyromellitic dianhydride (PMDA), or any other monomer with two reactive groups which will react with the first reactant.

In some embodiments the substrate is contacted with the first precursor prior to being contacted with the second precursor. Thus, in some embodiments the substrate is contacted with an amine, such as a diamine, for example 1,6-diamnohexane (DAH) prior to being contacted with another precursor. However, in some embodiments the substrate may be contacted with the second precursor prior to being contacted with the first precursor. Thus, in some embodiments the substrate is contacted with an anhydride, such as furan-2,5-dione (maleic acid anhydride), or more particularly a dianhydride, e.g., pyromellitic dianhydride (PMDA) prior to being contacted with another precursor.

Although the above described processes begin with contacting the substrate with the first vapor phase precursor, in other embodiments a process may begin with contacting the substrate with the second vapor phase precursor. It will be understood by the skilled artisan that contacted the substrate with the first precursor and second precursor are interchangeable in the processes described herein.

In some embodiments, different reactants can be used to tune the film properties. For example, a polyimide film could be deposited using 4,4'-oxydianiline or 1,4-diaminobenzene instead of 1,6-diaminohexane to get a more rigid structure with more aromaticity and increased dry etch resistance.

In some embodiments the reactants do not contain metal atoms. In some embodiments the reactants do not contain semimetal atoms. In some embodiments one of the reactants comprises metal or semimetal atoms. In some embodiments the reactants contain carbon and hydrogen and one or more of the following elements: N, O, S, P or a halide, such as Cl or F. In some embodiments the first reactant may comprise, for example, adipoyl chloride (AC).

Deposition conditions for the passivation layer can differ depending upon the selected reactants and can be optimized upon selection. In some embodiments the reaction temperature can be selected from the range of about 80° C. to about 250° C. In some embodiments, for example where the selectively deposited organic film comprises polyimide, the reaction temperature can be selected from the range of about 170° C. to about 210° C. In some embodiments, for example where the selectively deposited organic film comprises polyamide, the reaction temperature can be selected from a range of about 80° C. to about 150° C. In some embodiments where the selectively deposited organic film comprises polyimide the reaction temperature may be greater than about 160° C., 180° C., 190° C., 200° C., or 210° C. In some embodiments where the selectively deposited organic film comprises polyamide the reaction temperature may be greater than about 80° C., 90° C., 100° C., 110° C., 120° C., 130° C., 140° C., or 150° C.

In some embodiments the selectively deposited or formed organic film does not contain metal atoms. In some embodiments the selectively deposited or formed organic film does not contain semimetal atoms. In some embodiments the selectively deposited or formed organic film contains metal or semimetal atoms. In some embodiments the selectively deposited or formed organic film contains carbon and hydrogen and one or more of the following elements: N, O, S, or P.

In some embodiments reactants for use in the selective deposition for forming an organic passivation layer may have the general formula:

$$R^1(NH_2)_2 \qquad (1)$$

Wherein $R^1$ may be an aliphatic carbon chain comprising 1-5 carbon atoms, 2-5 carbon atoms, 2-4 carbon atoms, 5 or fewer carbon atoms, 4 or fewer carbon atoms, 3 or fewer carbon atoms, or 2 carbon atoms. In some embodiments the bonds between carbon atoms in the reactant or precursor may be single bonds, double bonds, triple bonds, or some combination thereof. Thus, in some embodiments a reactant may comprise two amino groups. In some embodiments the amino groups of a reactant may occupy one or both terminal positions on an aliphatic carbon chain. However, in some embodiments the amino groups of a reactant may not occupy either terminal position on an aliphatic carbon chain. In some embodiments a reactant may comprise a diamine. In some embodiments a reactant may comprise an organic precursor selected from the group of 1,2-diaminoethane (1), 1,3-diaminopropane (1), 1,4-diaminobutane (1), 1,5-diaminopentane (1), 1,2-diaminopropane (1), 2,3-butanediamine, 2,2-dimethyl-1,3-propanediamine (1).

In some embodiments reactants for use in the selective deposition processes for forming an organic passivation layer may have the general formula:

$$R^2(COCl)_2 \qquad (2)$$

Wherein $R^2$ may be an aliphatic carbon chain comprising 1-3 carbon atoms, 2-3 carbon atoms, or 3 or fewer carbon atoms. In some embodiments the bonds between carbon atoms in the reactant or precursor may be single bonds, double bonds, triple bonds, or some combination thereof. In some embodiments a reactant may comprise a chloride. In some embodiments a reactant may comprise a diacyl chloride. In some embodiments a reactant may comprise an organic precursor selected from the group of oxalyl chloride (I), malonyl chloride, and fumaryl chloride.

In some embodiments, a reactant comprises an organic precursor selected from the group of 1,4-diisocyanatobutane or 1,4-diisocyanatobenzene. In some embodiments a reactant comprises an organic precursor selected from the group of terephthaloyl dichloride, alkyldioyl dichlorides, such as hexanedioyl dichloride, octanedioyl dichloride, nonanedioyl dichloride, decanedioyl dichloride, or terephthaloyl dichloride. In some embodiments, a reactant comprises an organic precursor selected from the group of 1,4-diisothiocyanatobenzene or terephthalaldehyde. In some embodiments, a reactant being vaporized can be also a diamine, such as 1,4-diaminobenzene, decane-1,10-diamine, 4-nitrobenzene-1,3-diamine, 4,4'-oxydianiline, or ethylene diamine. In some embodiments, a reactant can be a terephthalic acid bis(2-hydroxyethyl) ester. In some embodiments a reactant can be a carboxylic acid, for example alkyl-, alkenyl-, alkadienyl-dicarboxylic or tricarboxylic acid, such as ethanedioic acid, propanedioic acid, butanedioic acid, pentanedioic acid or propane-1,2,3-tricarboxylic acid. In some embodiments, a reactant can be an aromatic carboxylic or dicarboxylic acid, such as benzoic acid, benzene-1,2-dicarboxylic acid, benzene-1,4-dicarboxylic acid or benzene-1,3-dicarboxylic acid. In some embodiments, a reactant may comprise one or more OH-groups bonded to a hydrocarbon. In some embodiments, a reactant can be selected from the group of diols, triols, aminophenols such as 4-aminophenol, benzene-1,4-diol or benzene-1,3,5-triol. In some embodiments, a reactant can be 8-quinolinol. In some embodiments, the reactant can comprise alkenylchlorosilanes, like alkenyltrichlorosilanes, such as 7-octenyltrichlorosilane.

Following selective deposition of an organic passivation layer on the metal surface, an oxide may be selectively deposited on the dielectric surface relative to the metal surface, as described herein.

Deposition of SiOC and SiOCN

As mentioned above, in some embodiments SiOC is selectively deposited on a dielectric surface relative to a metal or metallic surface. The SiOC may be deposited, for example, as described herein or as described in U.S. patent application Ser. No. 15/588,026, which is incorporated by reference herein.

In some embodiments SiOCN is selectively deposited on a dielectric surface relative to a metal or metallic surface. The SiOCN may be deposited, for example, as described herein, or as described in U.S. patent application Ser. No. 14/939,984 or 15/342,943, each of which is incorporated by reference herein.

In some embodiments, SiOSC is selectively deposited on a dielectric surface relative to a metal or metallic surface. The SiOSC may be deposited, for example, as described herein or as described in U.S. Patent Application No. 62/502,118, which is incorporated by reference herein.

The formula of the silicon oxycarbide films is generally referred to herein as SiOC for convenience and simplicity. As used herein, SiOC is not intended to limit, restrict, or define the bonding or chemical state, for example the oxidation state of any of Si, O, C and/or any other element in the film. Further, in some embodiments SiOC thin films may comprise one or more elements in addition to Si, O and C. For example, in some embodiments SiOCN films may be deposited that comprise from about 0% to about 10% nitrogen on an atomic basis (at %). In some embodiments an SiOSC film may be deposited that comprises from about 0 to about 20% sulfur on an atomic basis.

In some embodiments the SiOC may comprise from about 0% to about 30% carbon on an atomic basis. In some embodiments the SiOC films may comprise from about 0% to about 70% oxygen on an atomic basis. In some embodiments the SiOC films may comprise about 0% to about 50% silicon on an atomic basis.

All atomic percentage (i.e., at %) values provided herein exclude hydrogen for simplicity and because hydrogen is difficult to accurately analyze quantitatively, unless otherwise indicated. However, in some embodiments, if it is possible to analyze the hydrogen with reasonable accuracy, the hydrogen content of the films is less than about 20 at %, less than about 10 at % or less than about 5 at %. In some embodiments the deposited SiOC thin film may contain up to about 70% oxygen on an atomic basis (at %). In some embodiments a SiOC film may comprise oxygen from about 10% to about 70%, from about 15% to about 50%, or from about 20% to about 40% on an atomic basis. In some embodiments a SiOC film may comprise at least about 20%, about 40% or about 50% oxygen on an atomic basis.

In some embodiments the deposited SiOC thin film may contain up to about 40% carbon on an atomic basis (at %). In some embodiments a SiOC film may comprise carbon from about 0.1% to about 40%, from about 0.5% to about 40%, from about 1% to about 30%, or from about 5% to about 20% on an atomic basis. In some embodiments a SiOC film may comprise at least about 1%, about 10% or about 20% carbon on an atomic basis.

In some embodiments the deposited SiOC thin film may contain up to about 50% silicon on an atomic basis (at %). In some embodiments a SiOC film may comprise silicon from about 10% to about 50%, from about 15% to about 40%, or from about 20% to about 35% on an atomic basis. In some embodiments a SiOC film may comprise at least about 15%, about 20%, about 25% or about 30% silicon on an atomic basis.

In some embodiments the deposited SiOC thin film may contain up to about 40% sulphur on an atomic basis (at %). In some embodiments a SiOC film may comprise sulphur from about 0.01% to about 40%, from about 0.1% to about 40%, from about 0.5% to about 30%, or from about 1% to about 20% on an atomic basis. In some embodiments a SiOC film may comprise at least about 1%, about 10% or about 20% sulphur on an atomic basis. In some embodiments, the deposited SiOC films do not comprise an appreciable amount of nitrogen. However, in some embodiments a SiOC film comprising nitrogen is deposited. In some embodiments, the deposited. SiOC films comprises less than about 30 at %, less than about 20 at %, less than about 15 at %, less than about 10 at %, less than about 5 at % of nitrogen, less than about 1 at % nitrogen, or less than about 0.1 at % nitrogen. In some embodiments the SiOC thin films do not comprise nitrogen.

As discussed above, in some embodiments a SiOC film may comprise Si—C bonds and/or Si—O bonds. In some embodiments a SiOC film may additionally comprise Si—N bonds. In some embodiments a SiOC film may additionally comprise Si—S bonds. In some embodiments a SiOC film may comprise Si—C bonds and Si—O bonds and may not comprise Si—N bonds. In some embodiments a SiOC film may comprise Si—N bonds and Si—O bonds and may not comprise Si—C bonds. In some embodiments a SiOC film may comprise Si—N bonds and Si—C bonds and may not comprise Si—O bonds. In some embodiments a SiOC film may comprise Si—S bonds, Si—C bonds, and Si—O bonds and may not comprise Si—N bonds. In some embodiments a SiOC film may comprise Si—S bonds and Si—C bonds, and may not comprise Si—O bonds. In some embodiments a SiOC film may comprise Si—S bonds, and Si—O bonds and may not comprise Si—C bonds. In some embodiments the SiOC films may comprise more Si—O bonds than Si—C bonds, for example a ratio of Si—O bonds to Si—C bonds may be from about 1:1 to about 10:1. In some embodiments a deposited SiOC film may comprise one or more of SiN, SiO, SiC, SiCN, SiON, SiOSC, SiSC, SiOS, and/or SiOC.

In some embodiments, plasma enhanced ALD (PE ALD) processes are used to deposit SiOC films. As mentioned above, in some embodiments the PEALD processes do not comprise oxygen plasma or plasma comprising oxygen species. Briefly, a substrate or workpiece is placed in a reaction chamber and subjected to alternately repeated surface reactions. In some embodiments, thin SiOC films are formed by repetition of a self-limiting ALD cycle. In some embodiments, for forming SiOC films, each ALD cycle comprises at least two distinct phases. The contacting and removal of a reactant from the substrate may be considered a phase.

In a first phase, a vapor phase first reactant comprising silicon contacts the substrate and forms no more than about one monolayer on the dielectric surface. This reactant is also referred to herein as "the silicon precursor," "silicon-containing precursor," or "silicon reactant" and may be, for example, (3-Aminopropyl)trimethoxysilane (APTMS), bis (triethoxysilyl)ethane (BTESE) or 3-methoxypropyltrimethoxysilane (MPTMS). In some embodiments the first reactant comprises both silicon and oxygen.

In a second phase, a second reactant comprising a reactive species contacts the substrate and may convert adsorbed silicon to SiOC on the dielectric surface. As discussed above, in some embodiments the second reactant comprises a hydrogen plasma, such as a $H_2$/Ar plasma, a nitrogen plasma, and/or a plasma generated in a noble gas.

In some embodiments, the second reactant comprises hydrogen radicals, hydrogen atoms and/or hydrogen plasma. The second reactant may comprise other species that are not hydrogen precursors. In some embodiments, the second reactant may comprise a plasma of nitrogen, radicals of nitrogen, or atomic nitrogen in one form or another. In some embodiments, the second reactant may comprise a species from a noble gas, such as He, Ne, Ar, Kr, or Xe, for example as radicals, in plasma form, or in elemental form. These reactive species from noble gases do not necessarily contribute material to the deposited film, but can in some circumstances contribute to film growth as well as help in the formation and ignition of plasma.

In some embodiments a gas that is used to form a plasma may flow constantly throughout the deposition process but only be activated intermittently.

In some embodiments a gas that is used to form a plasma does not comprise oxygen. In some embodiments the adsorbed silicon precursor is not contacted with a reactive species generated by a plasma from oxygen. In some embodiments a second reactant comprising reactive species is generated in a gas that does not comprise oxygen. For example in some embodiments a second reactant may comprise a plasma generated in a gas that does not comprise oxygen. In some embodiments the second reactant may be generated in a gas comprising less than about 1 atomic % (at %) oxygen, less than about 0.1 at % oxygen, less than about 0.01 at % oxygen, or less than about 0.001 at % oxygen.

In some embodiments a gas that is used to form a plasma does not comprise nitrogen. In some embodiments the adsorbed silicon precursor is not contacted with a reactive species generated by a plasma from nitrogen. In some embodiments a second reactant comprising reactive species is generated in a gas that does not comprise nitrogen. For example in some embodiments a second reactant may comprise a plasma generated in a gas that does not comprise nitrogen.

However, in some embodiments a gas that is used to form a plasma may comprise nitrogen. In some other embodiments the second reactant may comprise nitrogen radicals, nitrogen atoms and/or nitrogen plasma. In some embodiments the second reactant may be generated in a gas comprising less than about 25 atomic % (at %) nitrogen, less than about 20 at % nitrogen, less than about 15 at % nitrogen, less than about 10 at % nitrogen, less than about 5 at % nitrogen, less than about 1 at % nitrogen, less than about 0.1 at % nitrogen, less than about 0.01 at % nitrogen, or less than about 0.001 at % nitrogen. In some embodiments the second reactant may be generated in a gas comprising hydrogen and nitrogen, for example the second reactant may comprise $H_2$ and $N_2$. In some embodiments the second reactant may be generated in a gas having a ratio of $N_2$ to $H_2$ ($N_2/H_2$) of less than about 20%, less than about 10%, or less than about 5%.

In some embodiments a gas that is used to form a plasma does not comprise nitrogen or oxygen. In some embodiments the adsorbed silicon precursor is not contacted with a reactive species generated by a plasma from nitrogen or oxygen. In some embodiments a second reactant comprising reactive species is generated in a gas that does not comprise nitrogen or oxygen. For example in some embodiments a second reactant may comprise a plasma generated in a gas that does not comprise nitrogen or oxygen.

Additional phases may be added and phases may be removed as desired to adjust the composition of the final film that is selectively deposited on the dielectric surface.

In some embodiments for depositing a SiOC film, one or more deposition cycles begin by contacting the substrate with the silicon precursor, followed by the second plasma reactant. In other embodiments deposition may begin by contacting the substrate with the second plasma reactant, followed by the silicon precursor.

Excess reactant and reaction byproducts, if any, are removed from the vicinity of the substrate, and in particular from the substrate surface, between reactant contacting phases. In some embodiments excess reactant and reaction byproducts, if any, are removed from the substrate surface by, for example, purging the reaction chamber between reactant contacting phases, such as by purging with an inert gas. The flow rate and contacting time of each reactant is tunable, as is the removal step, allowing for control of the quality and various properties of the films.

In some embodiments a gas is provided to the reaction chamber continuously during each deposition cycle, or during the entire PEALD process, and reactive species are provided by generating a plasma in the gas, either in the reaction chamber or upstream of the reaction chamber. In some embodiments the gas comprises hydrogen. In some embodiments the gas comprises nitrogen. In some embodiments the gas may comprise noble gas, such as helium or argon. The flowing gas may also serve as a purge gas for the first and/or second reactant (or reactive species).

The deposition cycle is repeated until a SiOC film of the desired thickness is obtained on the dielectric surface. In some embodiments the deposition parameters, such as the precursor flow rate, contacting time, removal time, and/or reactants themselves, may be varied in one or more deposition cycles during the PEALD process in order to obtain a film with the desired characteristics.

In some embodiments the surface of the substrate is contacted with a reactant. In some embodiments a pulse of reactant is provided to a reaction space containing the substrate. The term "pulse" may be understood to comprise feeding reactant to the reaction chamber for a predetermined amount of time. The term "pulse" does not restrict the length or duration of the pulse and a pulse can be any length of time. In some embodiments the substrate is moved to a reaction space containing a reactant. In some embodiments the substrate is subsequently moved from a reaction space containing a first reactant to a second, different reaction space containing the second reactant.

In some embodiments, the substrate is contacted with the silicon reactant first. After an initial surface termination, if necessary or desired, the substrate is contacted with a first silicon reactant. In accordance with some embodiments, the first reactant pulse comprises a carrier gas flow and a volatile silicon species, such as APTMS or MPTMS, that is reactive with the dielectric surface. Accordingly, silicon species adsorb upon the dielectric surface.

In some embodiments the silicon reactant contacts the surface from about 0.05 seconds to about 5.0 seconds, about 0.1 seconds to about 3 seconds or about 0.2 seconds to about 1.0 seconds. The optimum contacting time can be readily determined by the skilled artisan based on the particular circumstances.

After sufficient time for about a molecular layer of silicon-containing species to adsorb on the substrate surface, excess first silicon reactant, and reaction byproducts, if any, are removed from the substrate surface. In some embodiments removing excess reactant and reaction byproducts, if any, may comprise purging the reaction chamber. In some embodiments the reaction chamber may be purged by stopping the flow of the first reactant while continuing to flow a carrier gas or purge gas for a sufficient time to diffuse or purge excess reactants and reactant by-products, if any, from the reaction space. In some embodiments the excess first precursor is purged with the aid of inert gas, such as nitrogen or argon. In some embodiments the substrate may be moved from the reaction space containing the first reactant to a second, different reaction space. In some embodiments, the first reactant is removed for about 0.1 seconds to about 10 seconds, about 0.3 seconds to about 5 seconds or about 0.3 seconds to about 1 second. Contacting and removal of the silicon reactant can be considered the first or silicon phase of the PEALD cycle.

In the second phase, a second reactant comprising a reactive species, such as hydrogen plasma is provided to the workpiece. Plasma may be generated in the reaction chamber or in a remote plasma generator and provided to the reaction chamber. For example, hydrogen plasma may be formed by generating a plasma in hydrogen in the reaction chamber or upstream of the reaction chamber, for example by flowing the hydrogen ($H_2$) through a remote plasma generator.

In some embodiments, plasma is generated in flowing $H_2$ gas. In some embodiments $H_2$ flow may be from about 0.1 to about 0.4 slpm. As mentioned above, in some embodiments a noble gas may also be included, such as Ar. The Ar co-flow may be, for example, about 2 slpm in some embodiments.

In some embodiments $H_2$ is provided to the reaction chamber before the plasma is ignited or hydrogen atoms or radicals are formed. In some embodiments the $H_2$ is provided to the reaction chamber continuously and hydrogen containing plasma, atoms or radicals is created or supplied when needed.

In some embodiments, plasma is generated in flowing $N_2$ gas. In some embodiments $N_2$ flow may be from about 0.1 to about 0.4 slpm. As mentioned above, in some embodiments a noble gas may also be included, such as Ar. The Ar co-flow may be, for example, about 2 slpm in some embodiments.

In some embodiments $N_2$ is provided to the reaction chamber before the plasma is ignited or hydrogen atoms or radicals are formed. In some embodiments the $N_2$ is provided to the reaction chamber continuously and nitrogen containing plasma, atoms or radicals is created or supplied when needed.

Typically, the second reactant, for example comprising hydrogen plasma, contacts the substrate for about 0.1 seconds to about 10 seconds. In some embodiments the second reactant, such as hydrogen containing plasma, contacts the substrate for about 0.1 seconds to about 10 seconds, 0.5 seconds to about 5 seconds or 0.5 seconds to about 2.0 seconds. However, depending on the reactor type, substrate type and its surface area, the second reactant contacting time may be even higher than about 10 seconds. In some embodiments, contacting times can be on the order of minutes. The optimum contacting time can be readily determined by the skilled artisan based on the particular circumstances.

In some embodiments the second reactant is provided in two or more distinct pulses, without introducing another reactant in between any of the two or more pulses. For example, in some embodiments a plasma, such as a hydrogen containing plasma, is provided in two or more sequential pulses, without introducing a Si-precursor in between the sequential pulses. In some embodiments during provision of plasma two or more sequential plasma pulses are generated by providing a plasma discharge for a first period of time, extinguishing the plasma discharge for a second period of time, for example from about 0.1 seconds to about 10 seconds, from about 0.5 seconds to about 5 seconds or about 1.0 seconds to about 4.0 seconds, and exciting it again for a third period of time before introduction of another precursor or a removal step, such as before the Si-precursor or a purge step. Additional pulses of plasma can be introduced in the same way. In some embodiments a plasma is ignited for an equivalent period of time in each of the pulses.

In some embodiments plasma, for example hydrogen or nitrogen containing plasma, may be generated by applying RF power of from about 10 W to about 5000 W, from about 10 W to about 2000 W, from about 50 W to about 1000 W, from about 300 W to about 500 W, from about 100 W to about 500 W, or from about 30 W to about 100 W in some embodiments. In some embodiments, a plasma power used for generating a nitrogen-containing plasma can be about 10 W to about 5000 W, about 50 W to about 1,500 W, about 70 W to about 1200 W, about 80 W to about 1,000 W, about 10 W to about 500 W, or about 300 W to about 500 W. In some embodiments the RF power density may be from about 0.02 W/cm$^2$ to about 2.0 W/cm$^2$, or from about 0.05 W/cm$^2$ to about 1.5 W/cm$^2$. The RF power may be applied to second reactant that during the plasma contacting time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate. In some embodiments the gap between the susceptor and showerhead plate is from about 0.1 cm to about 20 cm, from about 0.5 cm to about 5 cm, or from about 0.8 cm to about 3.0 cm.

After a time period sufficient to completely saturate and react the previously adsorbed molecular layer with the plasma pulse, any excess reactant and reaction byproducts are removed from the substrate surface.

In some embodiments removing excess reactant and reaction byproducts, if any, may comprise purging the reaction chamber. In some embodiments the reaction chamber may be purged by stopping the flow of the second reactant while continuing to flow a carrier gas or purge gas for a sufficient time to diffuse or purge excess reactants and reactant byproducts, if any, from the reaction space. In some embodiments the excess second precursor is purged with the aid of inert gas, such as nitrogen or argon, which is flowing throughout the PEALD cycle. In some embodiments the substrate may be moved from the reaction space containing the second reactant to a different reaction space. The removal may, in some embodiments, be from about 0.1 seconds to about 10 seconds, about 0.1 seconds to about 4 seconds or about 0.1 seconds to about 0.5 seconds. Together, the reactive species contacting and removal represent a second, reactive species phase in a SiOCN atomic layer deposition cycle.

The two phases together represent one ALD cycle, which is repeated to form SiOC thin films of a desired thickness.

According to some embodiments the PEALD reactions may be performed at temperatures ranging from about 25° C. to about 700° C., from about 50° C. to about 600° C., from about 20° C. to about 200° C., from about 75° C. to about 450° C., or from about 90° C. to about 300° C. In some embodiments the deposition temperature is about 100° C. to about 200° C. In some embodiments, the optimum reactor temperature may be limited by the maximum allowed thermal budget. Therefore, in some embodiments the reaction temperature is from about 300° C. to about 400° C. In some applications, the maximum temperature is around about 400° C., and, therefore the PEALD process is run at that reaction temperature.

According to some embodiments of the present disclosure, the pressure of the reaction chamber during processing is maintained at from about 0.01 Torr to about 50 Torr, or from about 0.1 Torr to about 10 Torr. In some embodiments the pressure of the reaction chamber is greater than about 6 Torr, or about 20 Torr. In some embodiments, a SiOCN deposition process can be performed at a pressure of about 1 Torr to about 500 Torr, about 1 Torr to about 20 Torr, about 2 Torr to about 10 Torr, about 20 Torr to about 50 Torr, or about 20 Torr to about 30 Torr.

In some embodiments oxide deposition is performed at a pressure of about 0.1 Torr or greater, or 1 Torr or greater. In some embodiments the pressure may be up to about 760 Torr, up to about 500 Torr or up to about 50 Torr.

According to some embodiments a SiOC or SiOCN thin film is selectively deposited on a dielectric surface on a substrate in a reaction space by a PEALD deposition process comprising at least one cycle comprising:

contacting the substrate with a silicon reactant such that silicon species adsorb onto the surface of the substrate;

removing excess silicon reactant and reaction byproducts, if any, from the substrate surface;

contacting the substrate with a second reactant comprising reactive species generated by plasma, such as reactive species comprising hydrogen or nitrogen;

removing excess second reactant and reaction byproducts, if any, from the substrate surface; and optionally repeating the contacting and removing steps to form a SiOC or SiOCN thin film of a desired thickness and composition.

A number of different suitable Si precursors can be used in the presently disclosed PEALD processes for forming SiOC and SiOCN.

In some embodiments, at least some Si precursors suitable for deposition of SiOCN by PEALD processes comprise nitrogen and have the following general formulas:

$$Si(OR^I)_{4-x}(R^{II}NR^{III}R^{IV})_x \qquad (1)$$

Wherein x=1-4, $R^I$ may be an independently selected alkyl group, $R^{II}$ may be an independently selected hydrocarbon group, and $R^{III}$ and $R^{IV}$ may be independently selected alkyl groups and/or hydrogens. In some embodiments $R^I$ and $R^{II}$ are $C_1$-$C_3$ alkyl ligands, such as methyl, ethyl, n-propyl, or isopropyl. In some embodiments $R^I$ may be a $C_1$-$C_4$ alkyl ligand, such as methyl, ethyl, n-propyl, isopropyl, or tertbutyl. In some embodiments $R^{II}$ is not a $C_3$ hydrocarbon. In some embodiments $R^{II}$ is a $C_1$-$C_2$ hydrocarbon or a $C_4$-$C_6$ hydrocarbon. In some embodiments $R^{II}$ may be an unsaturated hydrocarbon, such as a hydrocarbon containing one or more double bonds. In some embodiments $R^{II}$ may be an alkyl group where one of the hydrogens is removed. In some embodiments $R^{III}$ and $R^{IV}$ are hydrogen. In some embodiments $R^I$ is methyl, $R^{II}$ is n-propyl, $R^{III}$ is hydrogen, $R^{IV}$ is hydrogen, and x=1.

For example, an Si precursor may have the formula, (written in a more detailed manner in order to show bonding): $(R^I$—O—$)_{4-x}$Si(—$R^{II}$—$NR^{III}R^{IV}$)x, wherein x=1-4, $R^I$ may be an independently selected alkyl group, $R^{II}$ may be an independently selected hydrocarbon, and $R^{III}$ and $R^{IV}$ may be independently selected alkyl groups and/or hydrogens.

According to some embodiments, some Si precursors may have the following general formula:

$$Si(OR^I)_{4-x-y-z}(R^{II}NR^{III}R^{IV})_xH_y(OH)_z \qquad (2)$$

wherein x=1-4, y=0-3, and z=0-3, $R^I$ and $R^{II}$ may be an independently selected alkyl group, $R^{II}$ may be an independently selected hydrocarbon, and $R^{III}$ and $R^{IV}$ may be independently selected alkyl groups and/or hydrogens. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$L_nSi(OR^I)_{4-x-n}(R^{II}NR^{III}R^{IV})_x \qquad (3)$$

wherein n=1-3, x=0-3, $R^I$ may be an independently selected alkyl group, $R^{II}$ may be an independently selected hydrocarbon, and $R^{III}$ and $R^{IV}$ may be independently selected alkyl groups and/or hydrogens, and L is an independently selected alkyl group or halogen. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$L_nSi(OR^I)_{4-x-y-z-n}(R^{II}NR^{III}R^{IV})_xH_y(OH)_z \qquad (4)$$

wherein n=0-3 x=1-4, y=03, z=0-3, $R^I$ may be an independently selected alkyl group, $R^{II}$ may be an independently selected hydrocarbon, and $R^{III}$ and $R^{IV}$ may be independently selected alkyl groups and/or hydrogens, and L is an independently selected alkyl group or halogen. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^IO)_{4-x}Si(R^{II}-NH_2)_x \qquad 5)$$

wherein x=1-4, $R^I$ may be an independently selected alkyl group, and $R^{II}$ may be an independently selected hydrocarbon. In some embodiments $R^I$ and $R^{II}$ are $C_1$-$C_3$ alkyl ligands, such as methyl, ethyl, n-propyl, or isopropyl. In some embodiments $R^I$ is methyl, $R^{II}$ is n-propyl and x=1. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^IO)_3Si-R^{II}-NH_2 \qquad 6)$$

Wherein, $R^I$ may be an independently selected alkyl group, and $R^{II}$ may be an independently selected hydrocarbon. In some embodiments $R^I$ and $R^{II}$ are $C_1$-$C_3$ alkyl ligands, such as methyl, ethyl, n-propyl, or isopropyl. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^IO)_{4-x}Si(-[CH_2]_n-NH_2)_x \qquad 7)$$

wherein x=1-4, n=1-5, and $R^I$ may be an independently selected alkyl group. In some embodiments $R^I$ is a $C_1$-$C_4$ alkyl ligand, such as methyl, ethyl, n-propyl, or isopropyl. In some embodiments $R^I$ is methyl, and x=1.

In some embodiments the silicon precursor does not comprise a halogen. In some embodiments the silicon precursor may comprise at least one aminoalkyl ligand.

According to some embodiments a suitable silicon precursor may comprise at least one ligand which is bonded through carbon to silicon and contains at least one $NH_2$-group attached to a carbon chain, for example an aminoalkyl ligand. According to some embodiments a suitable silicon precursor may comprise at least one ligand which is bonded through carbon to silicon and contains an $NH_2$-group attached to a carbon chain, for example an aminoalkyl ligand, and may also comprise at least one ligand which is bonded to silicon through an oxygen atom and in which an alkyl group is bonded to oxygen, for example an alkoxide ligand. According to some embodiments a suitable silicon precursor may comprise at least one ligand which is bonded through carbon to silicon and contains at least one $NR^{III}R^{IV}$-group, wherein $R^{III}$ and $R^{IV}$ may be independently selected alkyl groups and/or hydrogens, attached to a carbon chain, for example an aminoalkyl ligand. According to some embodiments a suitable silicon precursor may comprise at least one ligand which is bonded through carbon to silicon and in which ligand at least one nitrogen is bonded to carbon. Further the one ligand which is bonded through carbon to silicon and in which ligand at least one nitrogen is bonded to carbon may comprise hydrogen bonded to nitrogen. According to some embodiments, in addition to a ligand which is bonded to silicon through carbon, a suitable silicon precursor may comprise also an alkoxy ligand, such as methoxy, ethoxy, n-propoxy, i-propoxy or tertbutoxy ligand. According to some embodiments, including some of the formulas of the above, a suitable silicon precursor comprises a carbon chain which is bonded to silicon through carbon, and in which there is an amino group, such as alkylamino or —$NH_2$ group, attached to the carbon chain and the carbon chain is a C1-C6 hydrocarbon, C2-C6 hydrocarbon or C2-C4 hydrocarbon, linear, branched or cyclic, containing only carbon and hydrogen. In some embodiments the carbon chain may be unsaturated and contain double carbon-carbon bonds. In some other embodiments the carbon chain may contain other atoms than carbon and hydrogen.

A number of different suitable Si precursors can be used in the presently disclosed PEALD processes for forming SiOC. In some embodiments the suitable Si precursors may not comprise nitrogen. In some embodiments a suitable Si precursor may comprise a silane.

In some embodiments a suitable Si precursor for forming SiOC may comprise two Si atoms connected by, or bonded to, at least one hydrocarbon group. In some embodiments a suitable Si precursor may comprise two Si atoms connected by, or bonded to, at least one alkyl group. In some embodiments a suitable Si precursor may comprise two Si atoms connected by, or bonded to, at least one alkoxy group. In some embodiments a suitable Si precursor may comprise two Si atoms connected by, or bonded to, at least one silyl group. In some embodiments a suitable Si precursor may comprise two Si atoms connected by, or bonded to, at least one silyl ether group. In some embodiments a suitable Si precursor may comprise at least one —SH group, wherein the —SH may be bonded to an alkyl chain or a silicon atom. In some embodiments a suitable Si precursor may comprise at least one mercapto group. In some embodiments a suitable Si precursor may comprise at least one —R—SH structure, wherein R may be a $C_1$-$C_5$ alkyl group. In some embodiments a suitable Si precursor may comprise at least one —SH group on an alkyl chain and one or more alkoxy groups bonded to a silicon atom.

In some embodiments a suitable Si precursor may comprise at least one Si atom attached or bonded to one or more alkoxy groups. In some embodiments a suitable Si precursor may comprise at least one Si atom attached or bonded to one or more alkyl groups. In some embodiments a suitable Si precursor may comprise at least one Si atom attached or bonded to at least an alkyl group and an alkoxy group.

In some embodiments, at least some Si precursors suitable for deposition of SiOC by PEALD processes may comprise bridged alkoxysilanes having the following general formula:

$$(R^{II}O)_3Si—R^I—Si(OR^{II})_3 \tag{1}$$

Wherein each of $R^I$ and $R^{II}$ may be independently selected alkyl groups. In some embodiments each of $R^I$ and $R^{II}$ are independently selected $C_1$-$C_5$ alkyl ligands; such as methyl, ethyl, n-propyl, isopropyl, tertbutyl, or pentyl.

According to some embodiments, some Si precursors may comprise bridged alkoxyalkylsilanes having the following general formula:

$$R^{III}_y(OR^{II})_xSi—R^I—Si(OR^{II})_xR^{III}_y \tag{2}$$

Wherein each of $R^I$, $R^{II}$, and $R^{III}$ may be independently selected alkyl groups, and x+y=3. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise cyclic alkoxysilanes having the following general formula:

$$(R^{II}O)_2Si—R^I_2—Si(OR^{II})_2 \tag{3}$$

Formula (3) may alternately be represented by the structural formula:

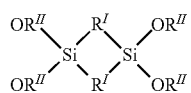

Wherein each of $R^I$ and $R^{II}$ may be independently selected alkyl groups. In some embodiments each of $R^I$ and $R^{II}$ are independently selected $C_1$-$C_5$ alkyl ligands, such as methyl, ethyl, n-propyl, isopropyl, tertbutyl, or pentyl.

According to some embodiments, some Si precursors may comprise cyclic alkoxyalkylsilanes having the following general formula:

$$R^{III}_y(OR^{II})_xSi—R^I_2—Si(OR^{II})_xR^{III}_y \tag{4}$$

Formula (4) may alternately be represented by the structural formula:

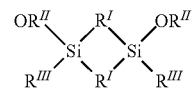

Wherein each of $R^I$, and $R^{II}$, and $R^{III}$ may be independently selected alkyl groups, and x+y=2. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise linear alkoxysilanes having the following general formula:

$$(R^{II}O)_3Si—(O—Si—R^I_2)_n—O—Si(OR^{II})_3 \tag{5}$$

Wherein $R^I$ may be an independently selected alkyl group or hydrogen, $R^{II}$ may be an independently selected alkyl group, and n=1-4. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^I$ may be hydrogen and $R^{II}$ may be an independently selected $C_1$-$C_5$ alkyl ligand.

According to some embodiments, some Si precursors may comprise linear alkoxysilanes having the following general formula:

$$R^{III}_y(OR^{II})_xSi—(—R^I—Si)_n—Si(OR^{II})_xR^{III}_y \tag{6}$$

Wherein each of $R^I$, $R^{II}$, and $R^{III}$ may be independently selected alkyl groups, x+y=2, and n can be greater than or equal to 1. In some embodiments $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise alkoxysilanes having the following general formula:

$$Si(OR^I)_4 \tag{7}$$

Wherein $R^I$ may be an independently selected alkyl group. In some embodiments $R^I$ may be an independently selected $C_1$-$C_5$ alkyl ligand, such as methyl, ethyl, n-propyl, isopropyl, tertbutyl, or pentyl.

According to some embodiments, some Si precursors may comprise alkoxyalkylsilanes having the following general formula:

$$Si(OR^I)_{4-x}R^{II}_x \tag{8}$$

Wherein each of $R^I$ and $R^{II}$ may be independently selected alkyl groups, and x=1-3. In some embodiments $R^I$ may be an independently selected $C_1$-$C_5$ alkyl ligand, such as methyl, ethyl, n-propyl, isopropyl, tertbutyl, or pentyl. In some embodiments $R^{II}$ may be an independently selected $C_1$-$C_8$ alkyl ligand.

According to some embodiments, some Si precursors may comprise alkoxysilanes that do not comprise nitrogen and have the following general formula:

$$Si(OR^I)_{4-x}R^{II}_x \tag{9}$$

Wherein $R^I$ may be an independently selected alkyl group, $R^{II}$ may be any ligand comprising carbon, hydrogen, and/or oxygen that does not comprise nitrogen, and x=1-3. In some embodiments $R^I$ may be an independently selected $C_1$-$C_5$ alkyl ligand, such as methyl, ethyl, n-propyl, isopropyl, tertbutyl, or pentyl. In some embodiments $R^{II}$ may comprise, for example an alkenyl, alkynyl, phenyl, carbonyl, aldehyde, ester, ether, carboxyl, peroxy, hydroperoxy, thiol, acrylate, or methacrylate ligand.

According to some embodiments, some Si precursors may the following general formula:

$$Si(OR^I)_{4-x}R^{II}_x \qquad (10)$$

Wherein x=0-3, $R^I$ may be an independently selected $C_1$-$C_7$ or $C_1$-$C_5$ alkyl ligand, and $R^{II}$ may be an independently selected ligand consisting of carbon, and/or hydrogen, and/or oxygen. For example, in some embodiments $R^{II}$ can be an alkoxyalkyl group. In some embodiments $R^{II}$ can be, for example, an alkenyl, alkynyl, phenyl, carbonyl, aldehyde, ester, ether, carboxyl, peroxy, or hydroperoxy group. In some embodiments, for example, $R^I$ is a methyl group, $R^{II}$ is a 3-methoxypropyl ligand, and x is 1.

According to some embodiments, some Si precursors may have the following general formula:

$$(R^IO)_{4-x}Si-(R^{II}-O-R^{III})_x \qquad (11)$$

Wherein x=0-3, each of $R^I$ and $R^{II}$ may be an independently selected $C_1$-$C_7$ or $C_1$-$C_5$ alkyl ligand, and $R^{III}$ may be an independently selected ligand consisting of carbon, and/or hydrogen, and/or oxygen. For example, in some embodiments $R^{III}$ can be, for example, an alkenyl, alkynyl, phenyl, carbonyl, aldehyde, ester, ether, carboxyl, peroxy, or hydroperoxy group. In some embodiments, for example, $R^I$, $R^{II}$, and $R^{III}$ can each be a group independently selected from methyl, ethyl, i-propyl, n-propyl, n-butyl, i-butyl, and t-butyl.

According to some embodiments, some Si precursors may have the following general formula:

$$Si(R^I)_{4-x-y}R^{II}_xR^{III}_y \qquad (12)$$

Wherein x+y=0-4, $R^I$ is an alkoxide ligand having from 1 to 5 carbon atoms, or a halide, $R^{II}$ is any ligand comprising sulfur, and $R^{III}$ consists of one of a sulfhydryl, sulfide, disulfide, sulfinyl, sulfonyl, sulfino, sulfo, thiocyanate, isothiocyanate, or carbonothioyl functionality. In some embodiments $R^I$, $R^{II}$, and $R^{III}$ may each be independently selected. In some embodiments $R^I$ may comprise a methoxy ligand, $R^{II}$ may comprise 3-mercaptopropyl, x=1, and y=0. That is, in some embodiments some an Si precursor may comprise $Si(OCH_3)_3C_3H_6SH$. In some embodiments a Si precursor may comprise mercaptomethylmethyldiethoxysilane, 3-mercaptopropylmethyldimethoxysilane and/or 3-mercaptopropyltriethoxysilane In some embodiments the silicon precursor does not comprise a halogen. In some embodiments the silicon precursor does not comprise nitrogen. In some embodiments the carbon chain may be unsaturated and contain double carbon-carbon bonds. In some other embodiments the carbon chain may contain other atoms than carbon and hydrogen.

In some embodiments the silicon precursor can comprise bis(triethoxysilyl)ethane (BTESE). In some embodiments the silicon precursor can comprise 3-methoxypropyltrimethoxysilane (MPTMS or $Si(OCH_3)_3C_3H_6OCH_3$). In some embodiments the silicon precursor can comprise (3-mercaptopropyl)trimethoxysilane.

In some embodiments more than one silicon precursor may contact the substrate surface at the same time during an ALD phase. In some embodiments the silicon precursor may comprise more than one of the silicon precursors described herein. In some embodiments a first silicon precursor is used in a first ALD cycle and a second, different ALD precursor is used in a later ALD cycle. In some embodiments multiple silicon precursors may be used during a single ALD phase, for example in order to optimize certain properties of the deposited film. In some embodiments only one silicon precursor may contact the substrate during the deposition. In some embodiments there may only be one silicon precursor and one second reactant or composition of second reactants in the deposition process. In some embodiments there is no metal precursor in the deposition process. In some embodiments the silicon precursor is not used as a silylating agent. In some embodiments the deposition temperature and/or the duration of the silicon precursor contacting step are selected such that the silicon precursor does not decompose. In some embodiments the silicon precursor may decompose during the silicon precursor contacting step. In some embodiments the silicon precursor does not comprise a halogen, such as chlorine or fluorine.

In some embodiments the second reactant may comprise reactive species formed from compounds having both N and H, such as $NH_3$ and $N_2H_4$, a mixture of $N_2/H_2$ or other precursors having an N—H bond. In some embodiments the second reactant may be formed, at least in part, from $N_2$. In some embodiments the second reactant may be formed, at least in part, from $H_2$ and $N_2$, where the $H_2$ and $N_2$ are provided at a flow ratio ($H_2/N_2$), from about 100:1 to about 1:100, from about 20:1 to about 1:20, from about 10:1 to about 1:10, from about 5:1 to about 1:5 and/or from about 2:1 to about 4:1, and in some cases 1:1. For example, a hydrogen-containing plasma for depositing SiOCN can be generated using both $N_2$ and $H_2$ at one or more ratios described herein.

In some embodiments the second reactant may be generated from a gas containing less than about 1 atomic % (at %) nitrogen, less than about 0.1 at % nitrogen, less than about 0.01 at % nitrogen, or less than about 0.001 at % nitrogen. In some embodiments a second reactant does not comprise $N_2$, $NH_3$ or $N_4$.

Deposition of Metal Oxides

As mentioned above, in some embodiments a metal oxide is selectively deposited on a dielectric surface relative to a metal or metallic surface. The metal oxide may be deposited, for example, as described herein or as described in U.S. Patent Application No. 62/502,118, which is incorporated by reference herein.

In some embodiments thin films comprising material other than SiOC may be selectively deposited by the processes as described herein. For example, in some embodiments metal oxide films may be selectively deposited by PEALD processes that do not include oxygen plasma or excited oxygen species, essentially as described for SiOC and SiOCN above but using different first precursors. In these embodiments a different metal precursor is used in place of the silicon precursor in the processes as described herein. In some embodiments, titanium oxide, niobium oxide, tantalum oxide, tungsten oxide, aluminum oxide or other metal oxide thin films may be selectively deposited by PEALD processes as described herein.

In some embodiments a metal oxide film may comprise more than one metal oxide. The different metals may be provided by the same precursor, or by two or more different metal precursors that are be provided in one or more deposition cycles.

In some embodiments oxide films comprising both silicon and metal may be selectively deposited as described herein by PEALD processes that do not include oxygen plasma or excited oxygen species. In some embodiments an oxide is selectively deposited that comprises both metal and silicon. In some embodiments an oxide film may comprise a mixture of a metal oxide and silicon oxide. In some embodiments an oxide film may comprise a metal silicate. For example, a film may comprise silicon oxide and one or more of a transition metal oxide, such as $ZrO_2$, $HfO_2$, or $TiO_2$, $Al_2O_3$, lanthanide (+Sc+Y) oxides, $Ta_2O_5$, or $Nb_2O_5$.

In some embodiments a metal precursor is used, along with a silicon precursor in the processes as described herein. In some embodiments a deposition cycle for depositing a metal oxide and a deposition cycle for depositing a silicon oxide may be provided at a selected ratio in a deposition process in order to selectively deposit a film having a desired composition.

In some embodiments a selective deposition process may comprise a single deposition cycle comprising alternately and sequentially contacting a substrate with a first metal precursor, a second silicon precursor and a third plasma reactant. The metal and silicon precursors and the third reactant can be as described herein for deposition of metal oxides and silicon oxides. The deposition cycle may begin with provision of the metal reactant, provision of the silicon reactant or provision of the third reactant. As described herein, provision of each of the reactants may be separated by a purge step in which excess reactants and reaction byproducts are removed from the reaction space. In some embodiments the ratio of the metal precursor and the silicon precursor is selected and/or adjusted to provide a mixed metal oxide film with the desired composition.

In some embodiments the metal precursors used to deposit oxide films comprising metal by the processes described herein may comprise volatile compounds comprising the desired metal and oxygen. A list of exemplary metal precursors that may be used to deposit metal oxide films by PEALD processes that do not include oxygen plasma or excited species of oxygen as described herein is provided in Table 1.

TABLE 1

PRECURSORS FOR THE DEPOSITION
OF METAL OXIDES THIN FILMS

| Precursor compound | Film material |
|---|---|
| Aluminum(III)ethoxide | $Al_2O_3$ |
| Niobium(V)ethoxide | $Nb_2O_5$ |
| Tantalum(V)ethoxide | $Ta_2O_5$ |
| Titanium (IV) ethoxide | $TiO_2$ |
| Titanium (IV) methoxide | $TiO_2$ |
| Titanium (IV) isopropoxide (TTIP) | TiO(CN) |
| Pentamethylcyclopentadienyltitanium trimethoxide | $TiO_2$ |
| W(thd)4 | $WO_x$ |

In some embodiments the metal precursor used to deposit metal oxide films by the processes described herein may comprise volatile compounds of formula:

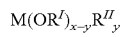

Wherein $R^I$ may be an independently selected hydrocarbon group and wherein M is a metal or Ge, for example a transition metal or Ge, Al, Ga, In, Sn, Pb, Bi, Sb, wherein x+y is equal to the oxidation state, or number of bonds of the metal atom, for example 3, 4, 5, or 6. In some embodiments where there is double or triple bonding of the metal atom, each double or triple bond may be counted two or three times when determining the value of x+y.

In some embodiments $R^{II}$ may be any ligand comprising carbon, hydrogen, nitrogen, halogen and/or oxygen. In some embodiments M is a transition metal selected from the group: Ti, V, Cr, Mn, Zr, Nb, Mo, Ru, Rh, Pd, Ag, Au, Hf, Ta, W, Re, Os, Ir and Pt.

In some embodiments M is a transition metal selected from the group: Cu, Fe, Co, Ni. In some embodiments M is a transition metal selected from the group: Au, Pt, Ir, Pd, Os, Ag, Re, Rh, and Ru.

In some embodiments $R^I$ may be an independently selected C1-C5 alkyl ligand, such as a methyl, ethyl, n-propyl, isopropyl, tertbutyl, or pentyl ligand. In some embodiments $R^I$ can comprise oxygen or nitrogen or another heteroatom.

In some embodiments $R^{II}$ may comprise, for example an alkenyl, alkynyl, cyclic hydrocarbons, amine, alkyamine, phenyl, carbonyl, aldehyde, ester, ether, carboxyl, peroxy, hydroperoxy, thiol, acrylate, or methacrylate ligand.

In some embodiments at least one of the ligands of the above formula above comprises oxygen. In some embodiments M can be also be a group 1 or 2 metal element.

In some embodiments the metal precursor used to deposit metal oxide films by the processes described herein may comprise volatile compounds of formula:

Wherein $R^I$ may be an independently selected alkyl group and wherein M is metal or Ge, for example transition metal or Ge, Al, Ga, In, Sn, Pb, Bi, Sb and wherein x is equal to the oxidation state, or number of bonds of the metal atom, for example 3, 4, 5, or 6.

In some embodiments where there is double or triple bonding of the metal atom, each double or triple bond may be counted two or three times when determining the value of x.

In some embodiments $R^I$ may be an independently selected $C_1$-$C_5$ alkyl ligand, such as methyl, ethyl, n-propyl, isopropyl, tertbutyl, or pentyl ligand.

In some embodiments M is a transition metal selected from the group: Ti, V, Cr, Mn, Zr, Nb, Mo, Ru, Rh, Pd, Ag, Au, Hf, Ta, W, Re, Os, Ir and Pt. In some embodiments M is a transition metal selected from the group: Cu, Fe, Co, Ni. In some embodiments M is a transition metal selected from the group: Au, Pt, Ir, Pd, Os, Ag, Re, Rh, and Ru. In some embodiments M may be a rare earth element, for example Sc, Y, La, Ce, or Nd.

In some embodiments the metal precursor used to deposit metal oxide films by the processes described herein may comprise at least one multidentate ligand, such as a bidentate ligand, for example a betadiketonate ligand (acac, thd) or another multidentate/bidentate ligand which is bonded to the metal atom through at least one oxygen. In some embodiments the metal precursor used to deposit metal oxide films by the processes described herein may comprise a cyclic ligand, such as cyclopentadienyl ligand.

In some embodiments the metal precursor used to deposit metal oxide films by the processes described herein may comprise an alkoxide precursor or alkoxide ligand. In some embodiments the metal precursor used to deposit metal oxide films by the processes described herein comprises at least one metal-oxygen bond. In some embodiments the metal precursor used to deposit metal oxide films by the processes described herein does not comprise a metal-oxygen bond, but comprises oxygen in the ligand. In some embodiments the metal precursor comprises metal or Ge, for example transition metal or Ge, Al, Ga, In, Sn, Pb, Bi, Sb, In some embodiments the metal precursor comprises group 1 or 2 metal element. In some embodiments M may be a rare earth element, for example Sc, Y, La, Ce, or Nd.

In some embodiments a metal oxide films may be deposited on a substrate comprising a photoresist or other organic material according to the processes described herein. In some embodiments a metal oxide film may be deposited on a substrate that may otherwise be destroyed by a PEALD process which includes oxygen plasma.

In some embodiments a metal oxide film is selectively deposited on a first surface relative to a second surface comprising a passivation layer, such as an organic passivation layer. In some embodiments the metal oxide deposition may also serve to remove some or all of the passivation layer. For example, a metal oxide film may be selectively deposited on a first dielectric surface relative to a metal or metallic surface, where the metal or metallic surface may comprise a passivation layer, such as an organic passivation layer.

In some embodiments the metal oxide films deposited according to the PEALD processes as described herein may have wet etch resistances that are higher than the wet etch resistance of similar metal oxide films deposited by PEALD processes that include oxygen plasma or excited oxygen species. As described herein, in some embodiments the formation of metal oxide films may be controlled by selecting a plasma power from a range, for example a range as described herein with respect to the deposition of SiOC, in a PEALD process in order to achieve a desired step coverage and/or WERR. That is, in some embodiments the process conditions used to control the formation of SiOC films as described herein can be used to control the formation of metal oxide films.

In some embodiments the second reactants used in the PEALD processes for depositing metal oxide thin films are the same as the second reactants described herein with respect to the deposition of SiOC. In some embodiments the second reactant comprises a plasma generated in a gas comprising a noble gas, such as Ar. As mentioned above, in some embodiments the second reactant is a plasma generated in a gas that does not comprise oxygen. In some embodiments the second reactant comprises plasma generated in Ar, plasma generated in Ar and $N_2$ or plasma generated in Ar and $H_2$. In some embodiments the second reactant can be selected to control the amount of particular components of the metal oxide film, such as carbon and/or nitrogen. In addition, the plasma power may be controlled to adjust the composition of the film.

In some embodiments a metal oxide comprising titanium is deposited by a PEALD process that does not use an oxygen plasma or other oxygen reactant. For example, a titanium oxide film may be deposited by a PEALD process using titanium isopropoxide (IV) (TTIP) in combination with a non-oxygen plasma. In some embodiments TTIP is utilized in a PEALD process in combination with a plasma generated in Ar, a plasma generated in a gas comprising Ar and nitrogen, or a plasma generated in a gas comprising Ar and hydrogen. In some embodiments, a titanium oxide film comprising carbon is deposited by a PEALD process in which a titanium reactant such as TTIP is utilized in combination with a plasma generated in a noble gas, such as in pure Ar gas. The amount of carbon may be tuned by varying the plasma power. In some embodiments a titanium oxide film comprising carbon and nitrogen (TiO(CN)) is deposited by a PEALD process using a titanium reactant such as TTIP in combination with a plasma generated in a gas comprising nitrogen, such as in a gas comprising Ar and $N_2$.

EXAMPLES

Figure 2A:
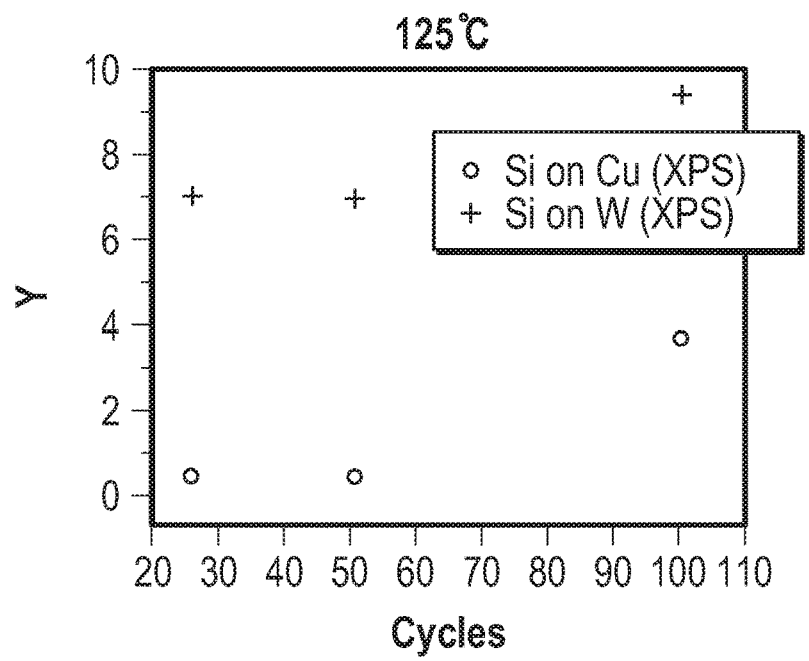
FIGS. 2A and 2B illustrate the selectivity between W and Cu of an MPTMS process at 125 and 200° C. The Y axis is in at. %.
Figure 2B:
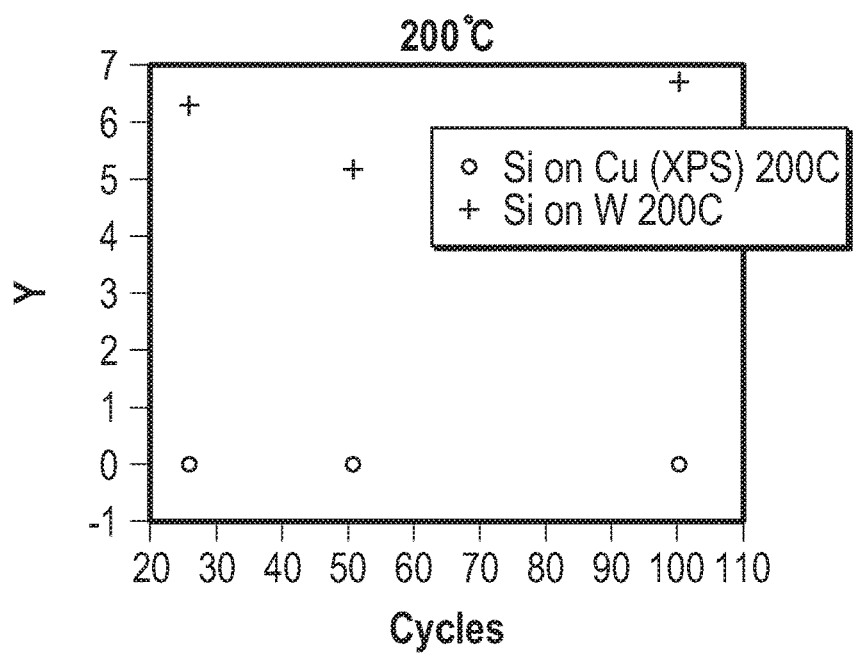

Experiments were carried out using 3-methoxypropyltrimethoxysilane (MPTMS) and $H_2$/Ar plasma in a SiOC PEALD process at 200 and 125° C. Natox, W and Cu were used as surfaces to study selectivity. 25, 50 and 200 cycles were applied after which the XPS spectra were recorded. FIG. 2 shows that at both temperatures there is more Si on W than on Cu. At 200° C. after 100 cycles no Si was detected on Cu. This selectivity can be realized between natox and Cu as well.

Figure 3:
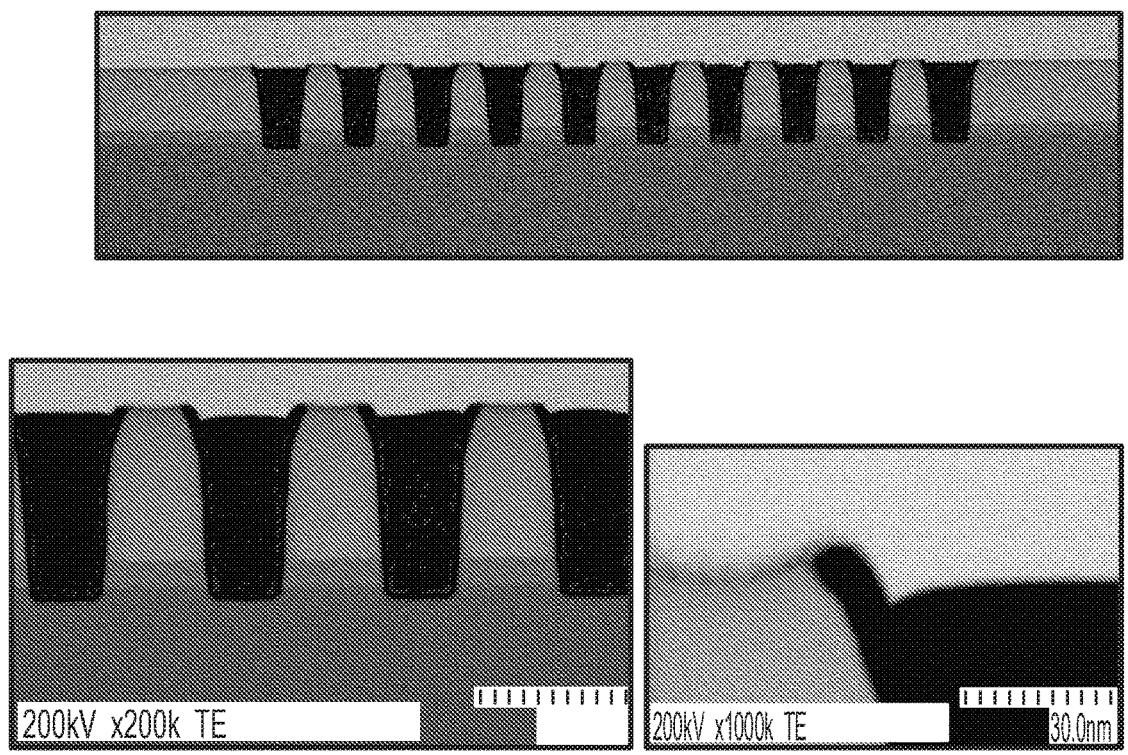
FIG. 3 3 illustrates selective deposition of SiOC on a low-k surface relative to a Cu surface by a PEALD process using $H_2$ plasma generated at a power of 67 W.
Figure 4:
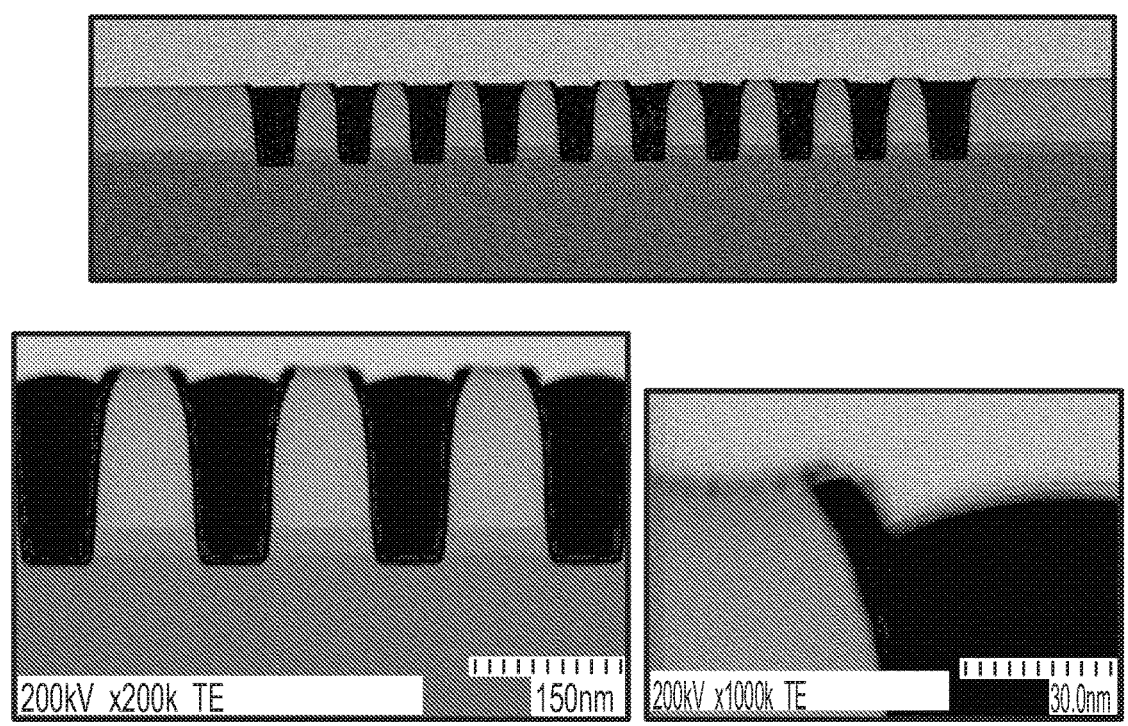
FIG. 4 illustrates selective deposition of SiOC on a low-k surface relative to a Cu surface by a PEALD process using $H_2$ plasma generated at a power of 300 W.

SiOC was also deposited on a substrate comprising a polyimide passivation layer on a substrate comprising Cu and low k surfaces. SiOC was deposited from MPTMS and H2 plasma and a SiOC film having a carbon concentration of less than 10 at. % was formed. Plasma was provided for 0.5 s at power of 67 or 300 Watts. A pressure of 4.7 Torr was utilized. SiOC growth was observed on the low k surfaces but not on the Cu surfaces, at both power settings, as shown in FIGS. 3 and 4.

In other experiments, SiOC was deposited by PEALD from MPTMS and H2/Ar plasma at a deposition temperature of 200° C. to 300° C., with a $H_2$ flow of 0.1 to 0.4 slpm (over 2 slpm Ar co-flow) and a plasma power of 30 to 100 W. SiOC films were deposited on silicon substrates comprising chemical oxide, as well as TiN and W surfaces. On silicon oxide, the process conditions could be tuned to produce SiOC films having very low k values (<3.5) and very low wet etch rate (<1 nm/min in dHF 0.7%). Minimal k values and wet etch rates were observed at about 300° C. with 0.2 slpm H2 flow and 70 W of power. Under such conditions, the deposited SiOC layer was found to have a k value of about 4 and a wet etch rate of 1 nm/min. The deposition of SiOC was also observed to be selective toward a number of materials, including W and TiN. The process produce a film of less than 1 nm on W but about 10.5 nm on $SiO_2$ after 500 cycles.

It was also observed that a lower temperature enhanced the growth of SiOC on TiN, as can be seen in Table 1 below. About 6.3 nm of SiOC was deposited on TiN at 200° C. with 500 cycles, while almost no growth was seen on TiN at 300° C. with 500 cycles. In contrast about 10 nm of SiOC was deposited on $SiO_2$ with 500 cycles at 200° C. and about 5.5 nm at 300° C.

TABLE 2

| Deposition temperature | TiN | Native Oxide |
| --- | --- | --- |
| 300° C. | ~1 nm/500 cycles | ~5.5 nm/500 cycles |
| 200° C. | ~6.5 nm/500 cycles | ~10 nm/500 cycles |

Figure 5A:
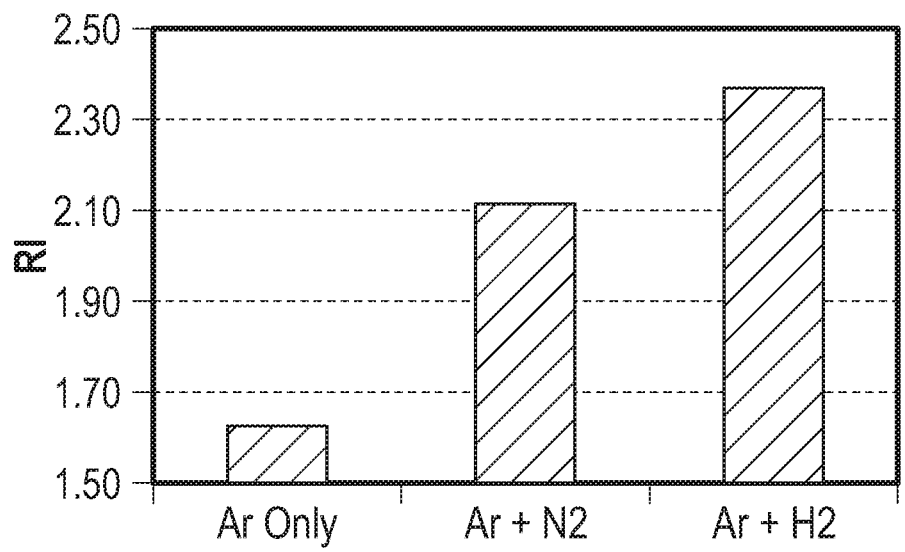
FIG. 5A is a graph showing the refractive index (R.I.) of TiO(CN) films deposited using titanium isopropoxide (IV) using different plasma reactants.
Figure 5B:
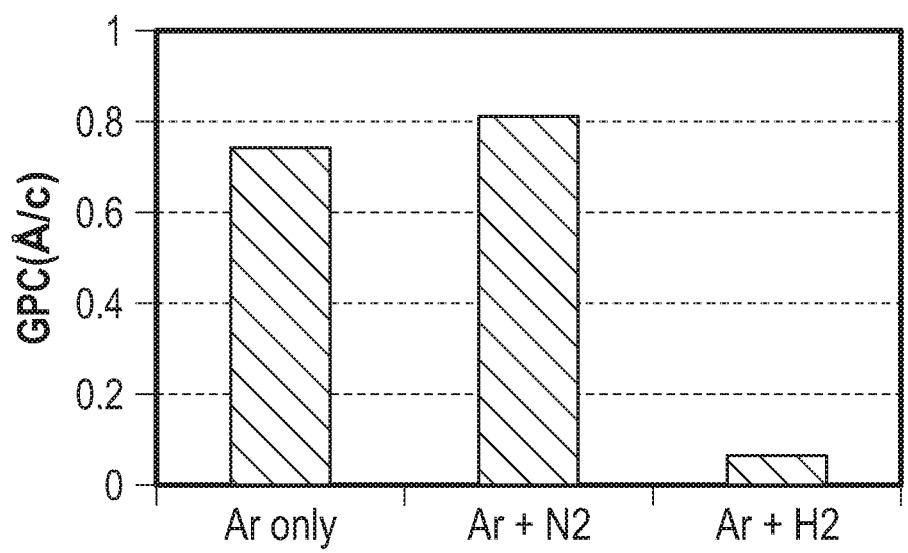
FIG. 5B is a graph showing the growth rate per cycle of TiO(CN) films deposited using titanium isopropoxide (IV) using different plasma reactants.

Titanium oxide thin films were deposited in a direct plasma PEALD reactor by an oxygen-free PEALD process using titanium isopropoxide (IV) (TTIP) as the titanium precursor. TTIP was provided from a source bottle heated at 70° C. The TTIP reactant was provided alternately and sequentially with three different plasma reactants. A plasma was generated in Ar, Ar and $N_2$, and Ar and $H_2$. Experiments were carried out at a deposition temperature of 200° C. FIG. 5A shows the refractive index of the resulting films. In the case of $H_2$-containing plasma, the refractive index is very close to that of $TiO_2$. However, the $N_2$-containing plasma and pure Ar plasma showed different refractive indices, indicating variable film composition. FIG. 5B shows the growth rate of the titanium oxide films using the three different plasma reactants.

Table 3, below, shows composition data derived from RBS and XPS. Both XPS and RBS indicate that $TiO_2$ films are deposited by $H_2$-containing plasma. No crystalline structure was seen by XRD measurement. Indicating that amorphous $TiO_2$ was deposited. The wet etch rate ratio (WERR) relative to thermal silicon oxide (TOX) in 0.5% dHF solution was about 0.5. This low WERR makes the films useful in some patterning applications. Four point probe resistivity measurements indicated extremely high resistivity of deposited $TiO_2$ films.

When pure Ar plasma was used as the plasma reactant, the resultant film was a carbon rich TiOC film. The carbon content may be modified by tuning plasma power. Additionally, $N_2$ containing plasma introduced nitrogen into the films, resulting in a TiOCN film.

TABLE 3

| | Ti (%) | O (%) | C (%) | N (%) |
|---|---|---|---|---|
| TTIP + AR PLASMA | | | | |
| RBS | 5.6 | 12.5 | 81.9 | — |
| XPS | 4.3 | 14.0 | 81.7 | — |
| TTIP + AR&H PLASMA | | | | |
| RBS | 35 | 65 | — | — |
| XPS | 33.9 | 66.1 | — | — |
| TTIP + AR&N PLASMA | | | | |
| RBS | 9.6 | 21.5 | 34.2 | 34.7 |
| XPS | 9.2 | 20.8 | 28.9 | 36.1 |

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A plasma enhanced atomic layer deposition (PEALD) process for selectively depositing an oxide on a dielectric surface of a substrate comprising:
   providing a substrate comprising a first dielectric surface and a second metal surface;
   conducting at least one deposition cycle comprising alternately and sequentially contacting the substrate with a first silicon precursor comprising oxygen and a second reactant comprising reactive species from a plasma generated in a gas comprising hydrogen and not oxygen;
   wherein the first precursor adsorbs on the substrate surface and the second reactant reacts with the adsorbed first precursor to selectively form an oxide on the first dielectric surface relative to the second metal surface.

2. The method of claim 1, wherein the second reactant also reacts with the metal surface to reduce any metal oxide on the metal surface.

3. The method of claim 1, wherein the second reactant also reacts with the metal surface to remove oxygen from the metal surface.

4. The method of claim 3, wherein removing oxygen from the metal surface comprises removing OH-groups or oxygen bridges from the metal surface.

5. The method of claim 1, wherein the dielectric surface comprises $SiO_2$.

6. The method of claim 1, wherein the dielectric surface comprises a low-k material.

7. The method of claim 1, wherein the metal surface comprises Ru, Co, Cu or W.

8. The method of claim 1, wherein the oxide is $SiO_2$, SiOC or SiOCN.

9. The method of claim 1, wherein the oxide is a metal oxide.

10. The method of claim 1, wherein the oxide comprises metal and silicon.

11. The method of claim 1, wherein the first precursor comprises 3-methoxypropyltrimethoxysilane (MPTMS).

12. The method of claim 1, wherein the deposition cycle begins with contacting the substrate with the second reactant.

13. The method of claim 1, additionally comprising contacting the substrate with a third plasma reactant prior to beginning the deposition cycle.

14. The method of claim 1, wherein the deposition cycle is repeated two or more times to form an oxide film of a desired thickness on the dielectric surface.

15. The method of claim 1, wherein the metal surface comprises a passivation layer.

16. The method of claim 15, wherein the passivation layer is an organic passivation layer.

17. The method of claim 16, wherein the organic passivation layer is selectively deposited on the metal surface relative to the dielectric surface prior to beginning the first deposition cycle.

18. The method of claim 15, wherein the passivation layer is etched by the second plasma reactant during each deposition cycle.

19. A method of selectively depositing a SiOC thin film on a dielectric surface of a substrate relative to a metal surface of the substrate by a plasma enhanced atomic layer deposition (PEALD) process comprising alternately and sequentially contacting the substrate with a first reactant comprising silicon and oxygen and a second reactant comprising plasma generated in a gas comprising hydrogen and not oxygen.

20. The method of claim 19, wherein the second reactant is formed by generating a plasma in a gas comprising $H_2$ and Ar.

21. The method of claim 20, wherein the plasma is generated using a power of about 30 to 200 W.

22. The method of claim 19, wherein the PEALD process is carried out at a deposition temperature of about 50 to 300° C.

23. The method of claim 19, wherein the metal surface comprises Co, Ru, Ni, W, TiN, Cu or Ta.

* * * * *